United States Patent
Ku et al.

(10) Patent No.: US 6,266,236 B1
(45) Date of Patent: *Jul. 24, 2001

(54) APPARATUS AND METHOD FOR CONNECTING AND ARTICULATING DISPLAY IN A PORTABLE COMPUTER HAVING MULTIPLE DISPLAY ORIENTATIONS

(75) Inventors: Edmond Ku, Sunnyvale; Richard Huang, Mountain View; Jenny Schlee, La Honda; Joshua Morenstein, San Francisco; Sonja Schiefer, Palo Alto, all of CA (US)

(73) Assignee: VADEM, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/334,278

(22) Filed: Jun. 16, 1999

Related U.S. Application Data

(63) Continuation-in-part of application No. 08/970,343, filed on Nov. 14, 1997, now Pat. No. 6,005,767, and a continuation-in-part of application No. 29/075,862, filed on Aug. 27, 1997, now Pat. No. Des. 416,003.

(51) Int. Cl.[7] ..................................................... G06F 1/16
(52) U.S. Cl. ..................... 361/681; 361/682; 312/223.1; 312/223.6; 345/169; 345/905
(58) Field of Search .................................. 361/681–683; 312/223.1–223.6; 345/169, 905

(56) References Cited

U.S. PATENT DOCUMENTS

| | | | |
|---|---|---|---|
| 4,238,792 | 12/1980 | Cohen et al. | 340/707 |
| 4,330,776 | 5/1982 | Dennison, Jr. et al. | 340/365 R |
| 4,438,458 | 3/1984 | Münscher | 358/254 |
| 4,517,660 | 5/1985 | Fushimoto et al. | 364/708 |
| 4,523,087 | 6/1985 | Benton | 235/379 |

(List continued on next page.)

FOREIGN PATENT DOCUMENTS

| | | | | |
|---|---|---|---|---|
| 0149 762 A1 | 11/1984 | (EP) | | G06F/1/00 |
| 0246 021 A2 | 5/1987 | (EP) | | G06F/1/00 |
| 0251 492 A2 | 5/1987 | (EP) | | G06F/1/00 |
| 0307 892 A2 | 9/1988 | (EP) | | G06F/1/00 |
| 0355 203 A2 | 12/1988 | (EP) | | G06F/1/00 |
| 0749 762 A2 | 12/1996 | (EP) | | 39/26 |
| 61-131356 | 8/1986 | (JP) | | G06F/1/00 |
| 1-131913 | 5/1989 | (JP) | | G06F/1/00 |
| 3-41326 | 4/1991 | (JP) | | G06F/1/16 |

*Primary Examiner*—Leo P. Picard
*Assistant Examiner*—Hung Van Duong
(74) *Attorney, Agent, or Firm*—Flehr Hohbach Test Albritton & Herbert LLP

(57) ABSTRACT

A portable computer. The computer includes a base, a display member, and an arm assembly coupling the display member to the base. The arm assembly includes a pair of spaced arm portions and a rigid connecting portion extending between the arm portions. The arm portions each have a first end pivotally coupled to the base edge for movement of the arm assembly between a closed position with the arm portion substantially parallel to the base and an open position with the arm portion oriented at an angle relative to the base, and a second end pivotally coupled to the display edge for pivotal movement of the display member relative to the arm portion to move the display member between a plurality of positions relative to the arm member.

38 Claims, 20 Drawing Sheets

U.S. PATENT DOCUMENTS

| | | | |
|---|---|---|---|
| 4,571,456 | 2/1986 | Paulsen et al. | 179/2 C |
| 4,589,659 | 5/1986 | Yokoi et al. | 273/1 GC |
| 4,718,740 | 1/1988 | Cox | 312/208 |
| 4,720,781 | 1/1988 | Crossland et al. | 364/200 |
| 4,742,478 | 5/1988 | Nigro, Jr. et al. | 364/708 |
| 4,785,564 | 11/1988 | Gurtler | 40/448 |
| 4,830,328 | 5/1989 | Takach, Jr. et al. | 248/639 |
| 4,839,837 | 6/1989 | Chang | 364/708 |
| 4,851,812 | 7/1989 | Holmberg | 340/407 |
| 4,859,092 | 8/1989 | Makita | 400/83 |
| 4,861,970 | 8/1989 | Hwang | 235/10 |
| 4,864,523 | 9/1989 | Sasaki | 364/708 |
| 4,885,430 | 12/1989 | Kinser, Jr. et al. | 174/254 |
| 4,903,222 | 2/1990 | Carter et al. | 364/708 |
| 4,949,079 | 8/1990 | Loebner | 340/706 |
| 4,960,256 | 10/1990 | Chihara et al. | 248/284 |
| 4,978,949 | 12/1990 | Herron et al. | 340/711 |
| 5,002,184 | 3/1991 | Lloyd | 206/305 |
| 5,100,098 | 3/1992 | Hawkins | 248/917 |
| 5,103,376 | 4/1992 | Blonder | 361/393 |
| 5,115,374 | 5/1992 | Hongoh | 361/393 |
| 5,168,423 | 12/1992 | Ohgami et al. | 361/394 |
| 5,200,913 | 4/1993 | Hawkins et al. | 364/708 |
| 5,233,502 | 8/1993 | Beatty et al. | 361/729 |
| 5,235,495 | 8/1993 | Blair et al. | 361/680 |
| 5,243,549 | 9/1993 | Oshiba | 364/708.1 |
| 5,255,214 | 10/1993 | Ma | 364/708.1 |
| 5,267,123 | 11/1993 | Boothroyd et al. | 361/680 |
| 5,276,589 | 1/1994 | Bartlett et al. | 361/681 |
| 5,308,174 * | 5/1994 | Kuki | 361/681 |
| 5,335,142 | 8/1994 | Anderson | 361/681 |
| 5,375,076 | 12/1994 | Goodrich et al. | 364/708.1 |
| 5,410,447 | 4/1995 | Miyagawa et al. | 361/681 |
| 5,481,430 | 1/1996 | Miyagawa et al. | 361/681 |
| 5,498,165 | 3/1996 | Tseng | 364/708.1 |
| 5,503,361 | 4/1996 | Kan-O et al. | 248/688 |
| 5,522,089 | 5/1996 | Kikinis et al. | 395/893 |
| 5,553,953 | 9/1996 | Herman et al. | 400/489 |
| 5,583,744 | 12/1996 | Oguchi et al. | 361/683 |
| 5,644,469 * | 7/1997 | Shioya et al. | 361/681 |
| 5,668,570 | 9/1997 | Ditzik | 361/681 |
| 5,668,695 | 9/1997 | Nakamura et al. | 361/683 |
| 5,768,163 | 6/1998 | Smith, II | 364/705.1 |
| 5,781,407 | 7/1998 | Brauel | 361/683 |
| 6,005,767 * | 12/1999 | Ku et al. | 361/681 |

* cited by examiner

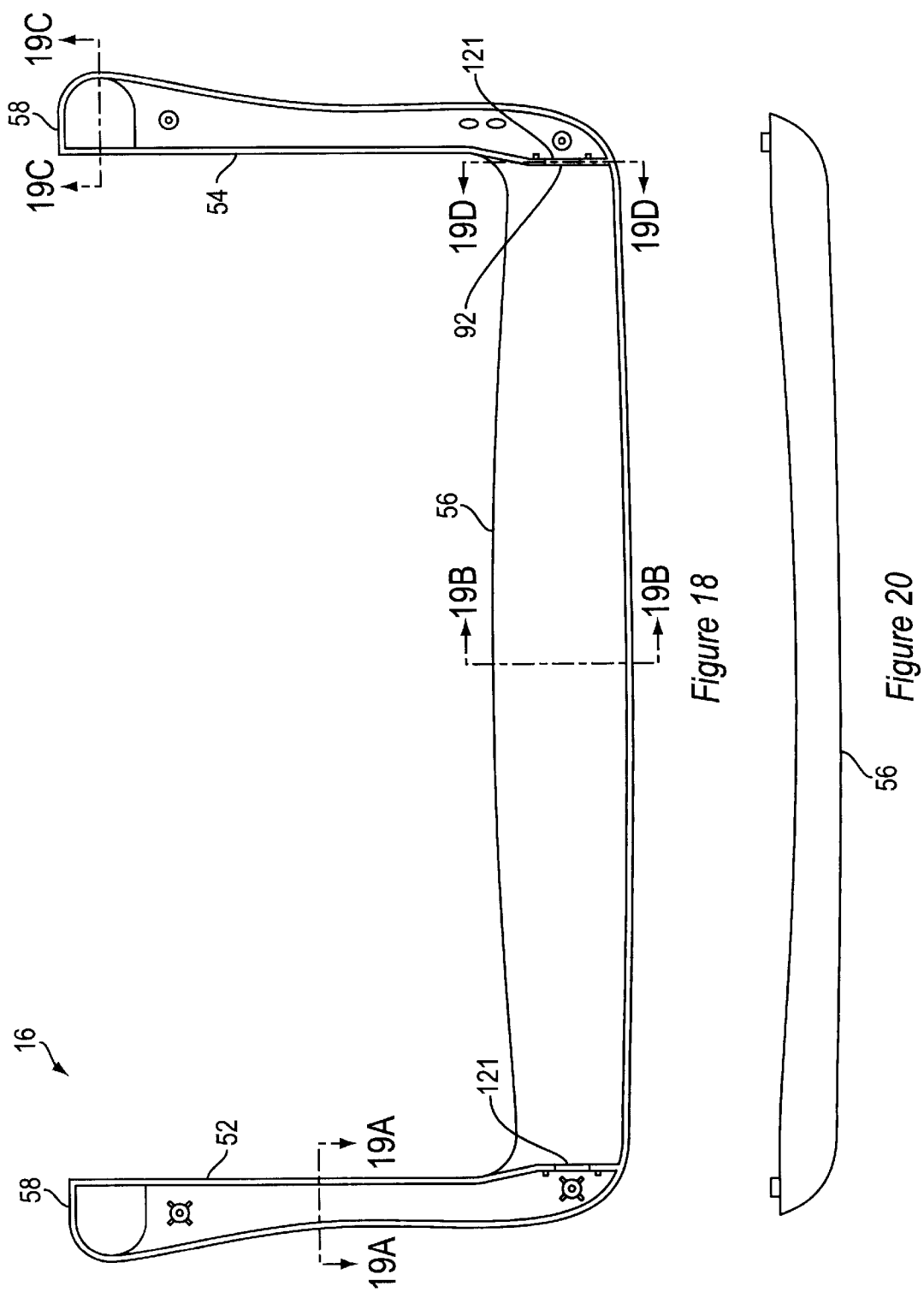

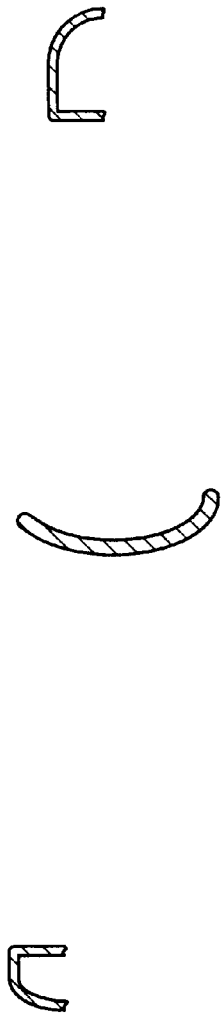
Figure 19C
Figure 19B
Figure 19A
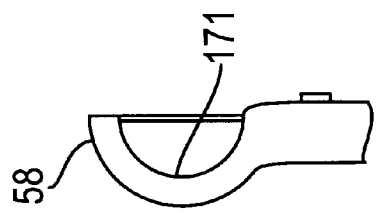
Figure 19E
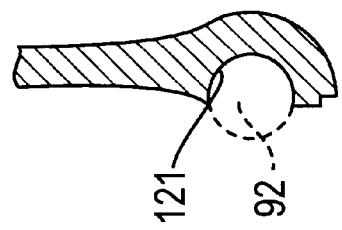
Figure 19D

APPARATUS AND METHOD FOR CONNECTING AND ARTICULATING DISPLAY IN A PORTABLE COMPUTER HAVING MULTIPLE DISPLAY ORIENTATIONS

RELATED APPLICATIONS

This application is a continuation-in-part application of U.S. patent application Ser. No. 08/970,343 filed Nov. 14, 1997, U.S. Pat. No. 6,005,767 and U.S. Design patent application Ser. No. 29/075,862 filed Aug. 27, 1997, U.S. Pat. No. D416,003 each herein incorporated by reference.

TECHNICAL FIELD

The present invention relates in general to a portable computer and, more particularly to a computer having a display screen which may be used to input information, and in which the display screen may be moved into a plurality of distict operating positions.

BACKGROUND OF THE INVENTION

Portable computing devices, including computers, laptop computers, notebook and subnotebook computers, and personal data organizers (PDA's) are typically unitary devices having a clam-shell configuration, with a base including the keyboard, optional hard drive and floppy disk drive unit, and other electrical components including a central processing unit CPU and memory, and a display component pivotally coupled to the base by a hinge. The display is movable about the hinge between a closed position, with the display screen positioned adjacent the keyboard, and an open position, with the display screen inclined at a viewing angle. With its reduced size and weight, this type of device is conveniently portable, allowing an individual to carry the computer and use the computer at different locations.

The reduced size, while improving the portability of the device, often creates discomfort when the computer is used for extended periods of time. For example, the user may have difficulty in orienting the display at a convenient viewing angle. With its clamshell configuration, the screen is positioned just above the keyboard, requiring the user to open the screen to an angle of at least 140° to conveniently view the screen without straining the neck, shoulders and upper back. However, in some situations factors such as the available space, lighting and the like may prevent the user from sufficiently opening the computer to conveniently view the display screen. It may also be difficult to place the display screen at the preferred viewing distance and still eliminate distracting reflections from environmental light sources. A portable computer in which the angle and height of the display may be adjusted relative to the base is desirable.

With some portable computers, the display is provided by a touch sensitive screen which may be used to input information by touching specific areas of the screen with an instrument or finger. An example of such computers is a notebook computer where data is entered solely through the touch sensitive screen, eliminating the need for a keyboard. Other types of computers include both a keyboard and a touch sensitive screen, providing the user with the option of entering data through the screen or keyboard.

U.S. Pat. No. 5,268,817 discloses an example of a portable computer which includes a keyboard and a touch sensitive screen. The display screen is mounted in an outer frame, which is in turn hingedly attached to the base in a clamshell configuration. The display screen is pivotal within the outer frame to orient the screen in a first position, with the screen facing in the general direction of the keyboard, and a second position flipped 180° relative to the first position. With the screen in the first position, the display may be moved between open and closed positions by pivoting the outer frame relative to the base in the same manner as standard portable computers. When the display screen is flipped 180° and the outer frame pivoted to the closed position covering the keyboard, the display screen is exposed such that the computer functions as a standard notebook computer. The disclosed computer combines the advantages of a notebook computer, where the individual enters information in the same matter as writing the information on a notepad, with the advantages of standard portable computer. However, the disadvantages created by the reduced size of the computer are present in the disclosed computer. A computer in which the screen may be conveniently adjusted to a variety of positions, including one in which the display covers the keyboard with the screen exposed, is desirable.

OBJECTS AND SUMMARY OF THE INVENTION

It is a primary object of this invention to provide a portable computer having an articulated display.

It is another object of this invention to provide a portable computer in which the display may be retained in a selected one of a plurality of different positions.

It is yet another object of this invention to provide a portable computer in which the display may be lowered onto the keyboard in a position leaving the screen exposed.

It is still another object of this invention to provide a portable computer in which the height and angle of the display relative to the base may be adjusted to a convenient viewing position.

A more general object of this invention is to provide a portable computer which is lightweight and convenient to transport, and which may be economically manufactured and maintained.

In summary, this invention provides a lightweight portable computer which is particularly convenient to use. The computer includes a base having an upper surface with a keyboard, a bottom surface and a peripheral edge joining the upper and bottom surfaces and a display having a front surface including a screen for displaying information, a back surface, and a peripheral edge joining the front and back surfaces. The display is coupled to the base by an arm assembly including a pair of spaced arm portions and a rigid connecting portion extending between the arm portions. The arm portions each have a first end pivotally coupled to the base edge for movement of the arm assembly between a closed position, with the arm portion substantially parallel to the base, and an open position, with the arm portion oriented at an angle relative to the base. The arm portions each have a second end pivotally coupled to the display edge for pivotal movement of the display member relative to the arm portion to move the display member between a plurality of positions relative to the arm member.

Additional objects and features of the invention will be more readily apparent from the following detailed description and appended claims when taken in conjunction with the drawings.

BRIEF DESCRIPTION OF THE DRAWINGS

FIG. 18 is illustration of some internal structure on the opposite face of the arm assembly shown in FIG. 17.

FIGS. 19a–19e show detail and partial sectional views of the arm structure in FIG. 18.

FIG. 20 is an alternative view of the arm assembly from a viewpoint location indicated in FIG. 18.

DETAILED DESCRIPTION OF EMBODIMENTS OF THE INVENTION

Figure 1:
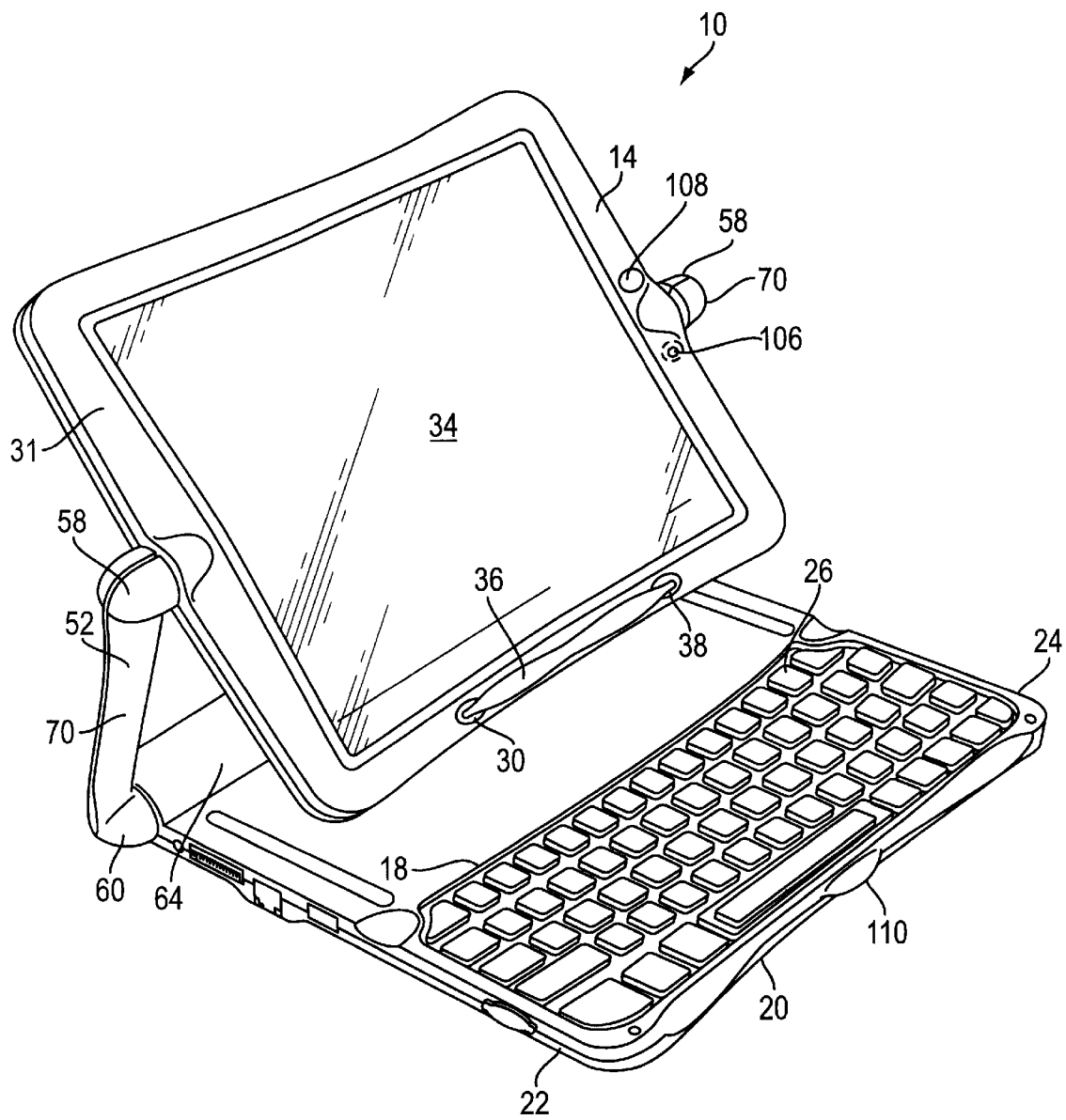
FIG. 1 is an illustration showing a perspective view of an embodiment of the inventive portable computer in a notebook mode configuration.
Figure 2:
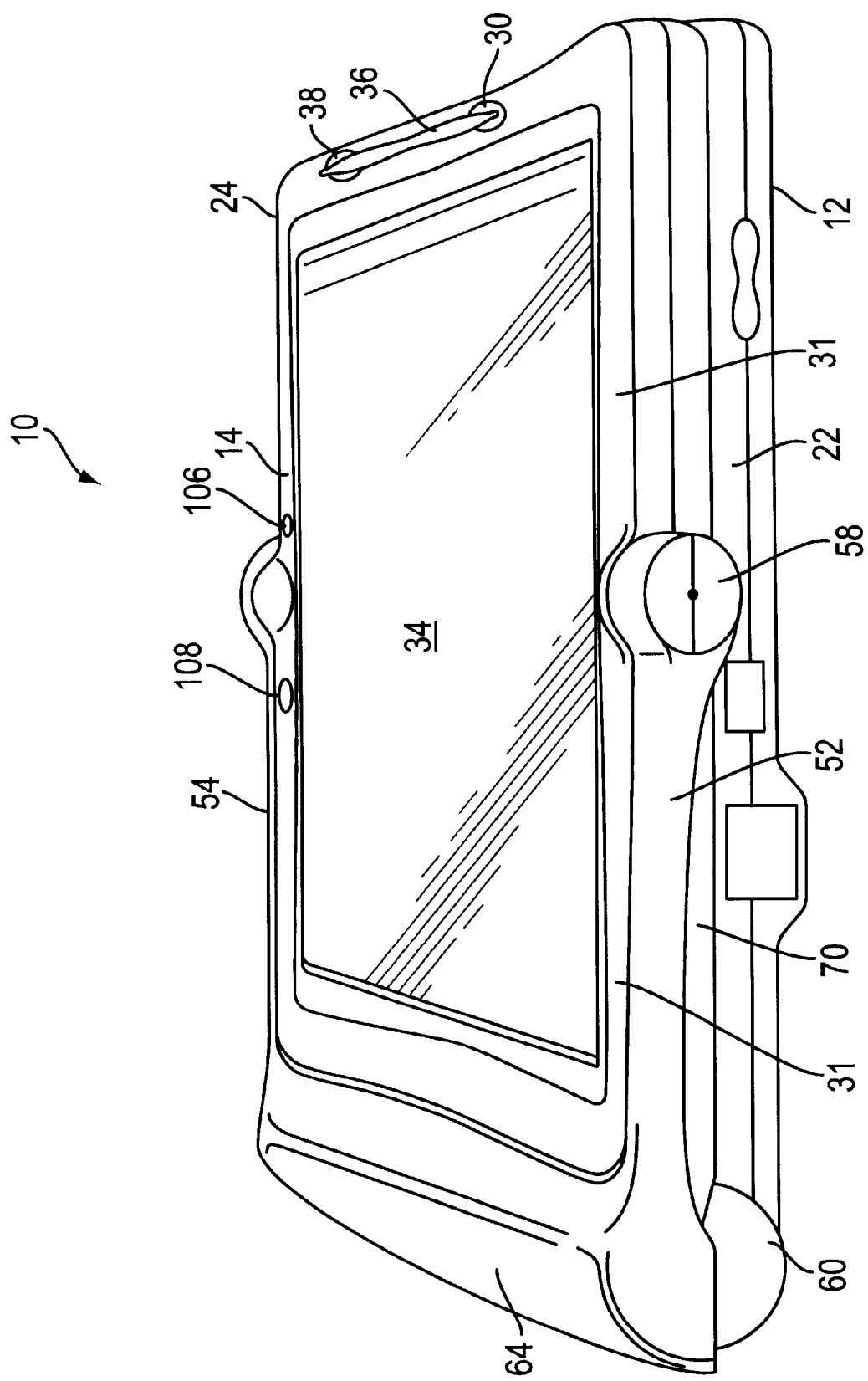
FIG. 2 is an illustration showing a perspective view of an embodiment of the inventive portable computer in a pen, stylus, or tablet mode configuration.

Reference will now be made in detail to the present embodiments of the invention, which are illustrated in the accompanying figures. Turning now to the drawings, wherein like components are designated by like reference numbers throughout the various figures, attention is first directed to FIGS. 1–3.

The inventive computer advantageously provides three user modes corresponding to physical configurations of the constituent parts, particularly to the relative orientation of the display screen front surface relative to the base, and the relationship between the base (and the display screen) relative to a supporting surface and the user. These three operating mode configurations are referred to as a notebook mode configuration (See perspective illustration in FIG. 1), a tablet mode configuration (See perspective illustration in FIG. 2), and a presentation mode configuration (See perspective illustration in FIG. 3). A closed mode is also provided for storage and transport or when computer 10 is not being used (See FIG. 12). Each of these three named mode configurations are associated with a range of movement, and intermediate configurations are also provided. The computer 10 may readily be configured by a user to any of the operating mode configurations during use, without tools, and without interrupting the computing session, as there is no need to power-down, suspend, or otherwise alter the computing session to adjust the physical configuration of the computer. In the descriptions that follow, the relative directions and orientations (for example, up, down, front, rear, top, and bottom) generally refer to orientations of the computer when in the notebook mode configuration, but the meaning will be clear to those skilled in the art with reference to the drawings. We first describe certain features of computer 10 with primary reference to the notebook configuration mode relative to FIGS. 4–6 which shows three views (front elevational view, top plan view, and side elevational view) of computer 10 in an open notebook mode configuration.

Portable computer 10, constructed in accordance with this invention, is particularly convenient to store, transport and use. The computer 10 generally includes a base 12, a display member 14, and an arm assembly coupling the display 14 to the base 12. The base 12 houses the internal working components of the computer, including the Central Processing Unit (CPU), optional hard drive, memory chips, including ROM and RAM, optional floppy disk drive unit, optional PC card slot(s), internal modem, infrared (IrDA) port, battery, electrical connectors and the like. Advantageously, the computer may be a single chip or "computer on a chip" or "system on a chip" type implementation to reduce size and weight of internal components, and power conservation procedures are implemented such that battery life of up to 20 hours or more is realized. The internal working electronic components of the computer 10 are well known and therefore are not described in further detail; however, certain internal structural and mechanical features as well as operational features are novel and described in detail hereinafter. One embodiment of the inventive portable computing device is configured for minimum size and weight eliminates the hard disc drive and floppy disc drive units and provides operating system (for example DOS, Windows 95, Windows 98, Windows 2000, or Windows CE) and predetermined software applications (for example, word processing, phone list, organizer, e-mail, graphics, and the like) in ROM. (Microsoft Windows CE is particularly suited for loading and executing from ROM and RAM without benefit of a hard disk drive.) Although not shown in detail, the base 12 is provided with a number of exterior ports as is known in the art to facilitate connection of the computer 10 to a printer, docking station of a desk top computer, peripheral devices, telephone line and the like.

Figure 11:
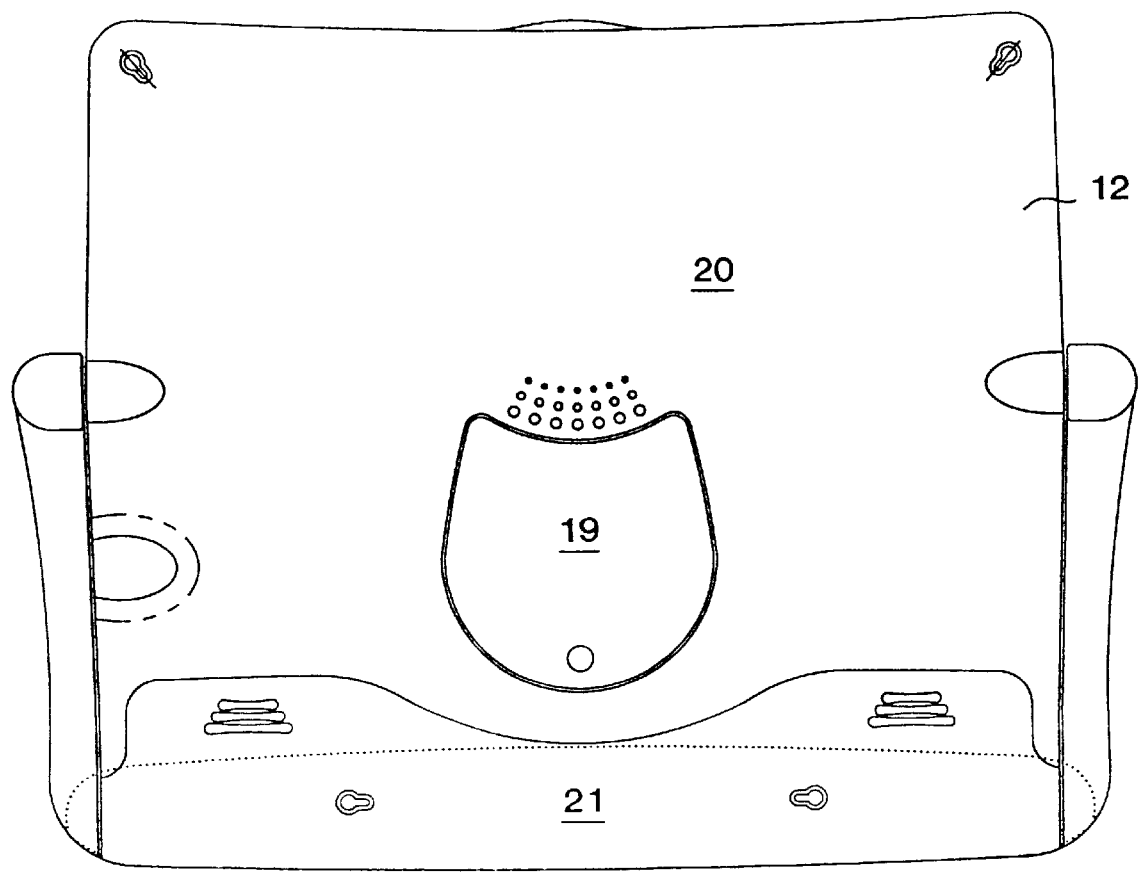
FIG. 11 is a bottom plan view of the computer of FIG. 4.

In the illustrated embodiment of the invention, the base 12 has a generally rectangular configuration including an upper surface 18 and a bottom surface 20 which is positionable on a support surface. The base is provided with removable doors 19 and 21 which provide access to the interior of the base for insertion of RAM chips (so that memory may be increased at user discretion) and removal and replacement of the battery (See FIG. 11 showing the bottom of computer 10 in the closed or storage mode configuration.). The base includes side edges 22 and 24 which may be provided with the opening of the optional disk drive unit(s) as well as one or more of the external ports. A keyboard 26 is positioned at the front end portion 28 of the base 12. In the preferred embodiment of the invention, the keyboard 26 is curved about an axis generally designated 28 intersecting the middle of the keyboard. This curved keyboard 26 allows the hands and wrists to be placed over the keys of the keyboard at a larger more natural angle than they would with a small keyboard having a non-curved array of keys. In one embodiment of the invention, the keyboard is 85% of the standard full sized QWERTY keyboard; however, the keyboard may be sized otherwise, including larger (for example 100% scale) and smaller scale). With this configuration, the keyboard 26 ergonomically positions the hands of the user with the elbows extending outwardly from the body. A standard, rectangular keyboard may be used instead of keyboard 26, although the shape of the standard keyboard has a tendency to cause the user to distort his wrists inwardly, particularly when the overall size of the base and keyboard are reduced. A port may also be optionally provided to attach external keyboard and/or pointing device to the computer.

Figure 12:
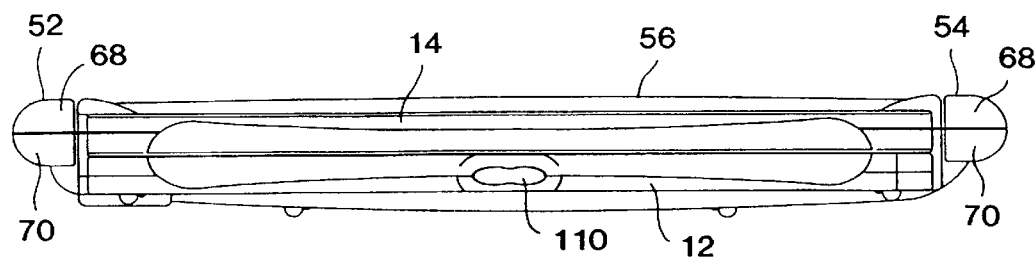
FIG. 12 is a front end view of the computer of FIG. 4, shown with the display overlying the base in a closed storage or traveling mode configuration.
Figure 13:
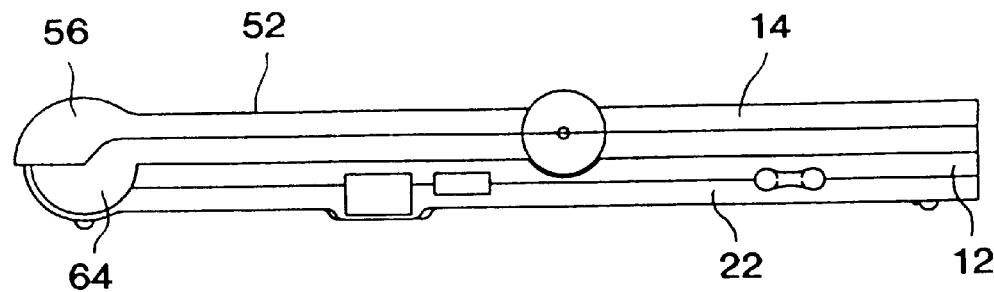
FIG. 13 is a first side view of the portable computer of FIG. 4, shown with the display overlying the base.
Figure 14:
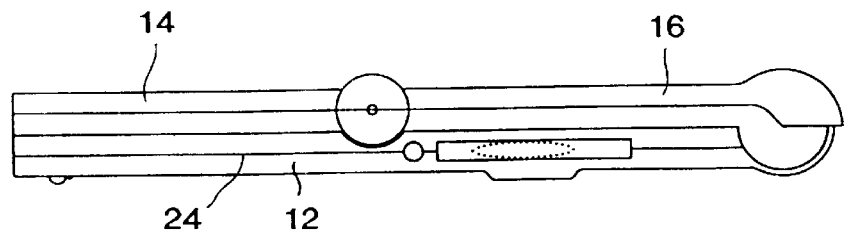
FIG. 14 is an opposite side view of the portable computer of FIG. 4, shown with the display overlying the base.

The display 14 generally includes a front surface 31 including a display screen 34, a back surface 32 and a peripheral edge 33. In the present embodiment of the invention, the screen 34 is a touch sensitive screen which both displays data and which may be used to input data into the computer. However, it is to be understood that in other embodiments of the invention the computer may include a screen which is only capable of displaying information. In such configurations, input to the computer may be by keyboard input and or other pointing device such as mouse, trackball, joy stick, or other touch sensitive pointing device. Voice navigation and/or input may also be provided and such systems, such as systems by IBM, Dragon System, for example, may be used. The screen 34 used in computer 10 of this embodiment is a backlit color Liquid Crystal Display (LCD) manufactured by Sharp to have a reduced thickness and weight. Touch sensitive screens are also available from other manufacturers, including Toshiba. As is known in the art, data may be entered through the screen 34 using an implement such as a touch stylus 36 or the user's finger including data, graphics, icons, pointer and other images which appear on the screen provide a Graphical User interface (GUI) and are controlled by software, with the displayed images typically including designated areas which may be contacted to input, edit, or otherwise access information. When the user touches one of the designated areas of the screen image, the touch sensitive screen 34 transmits a signal to the working components of the computer as is known in the art. In the illustrated embodiment, the front surface 31 of the display includes at least one clip retainer 38 for holding the stylus 36 when it is not in use, retaining the stylus in convenient reach of the user. The upper surface 18 of the base 12 is formed with a recess 40 shaped to receive the stylus 36 and clip retainer 38 when the computer is closed by moving the front surface 31 of the display 14 onto the base 12. The closed storage or traveling mode configuration is illustrated in a front end elevational view of the computer in FIG. 12, showing with the display overlying the base. FIGS. 13 and 14 provide two different side views of the portable computer shown with the display overlying the base. However, it is to be understood that other means may be employed to retain the stylus, and the stylus may be releasably attached to the base or arm assembly of the computer instead of the display or eliminated entirely so that an external stylus or the user's finger alone is used for pointing.

When the display 14 is closed onto the base 12 with the screen 34 facing the upper surface 18, the back surface 32 of the display 14 and the bottom surface 20 of the base 12 provide a protective outer cover. If additional protection is desired, the closed computer 10 may be slipped into a protective case (not shown).

Figure 5:
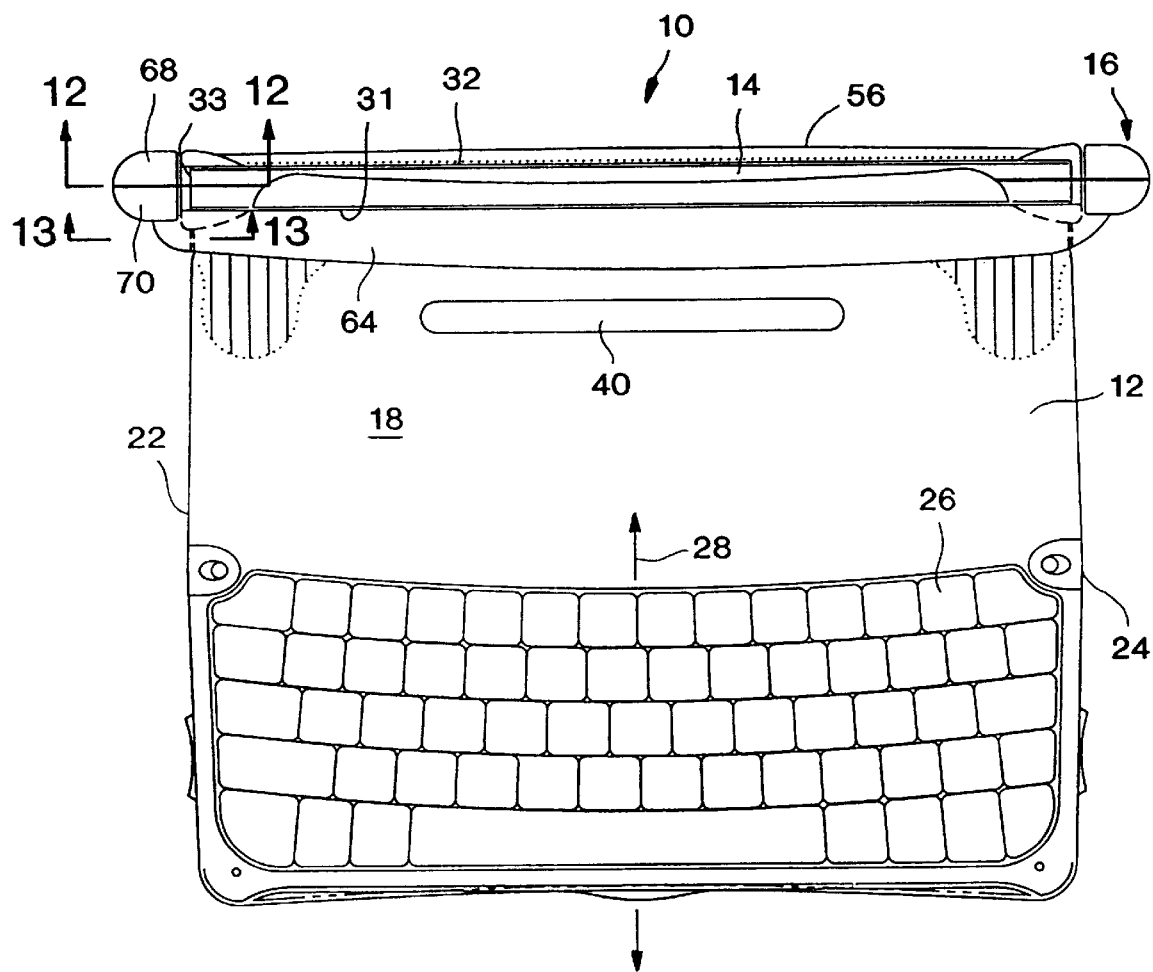
FIG. 5 is a top plan view of the computer of FIG. 4.
Figure 6:
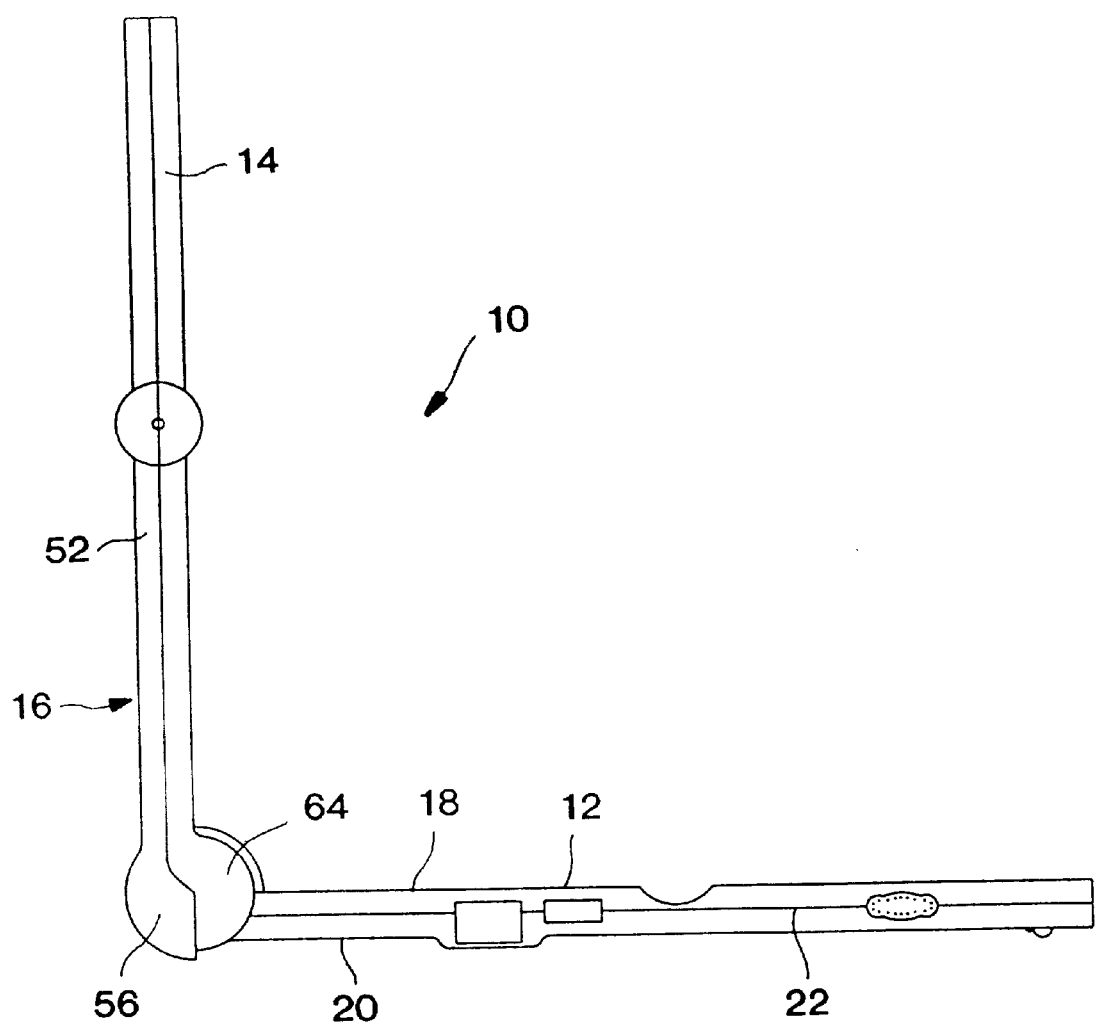
FIG. 6 is a side view of the computer of FIG. 4.
Figure 7:
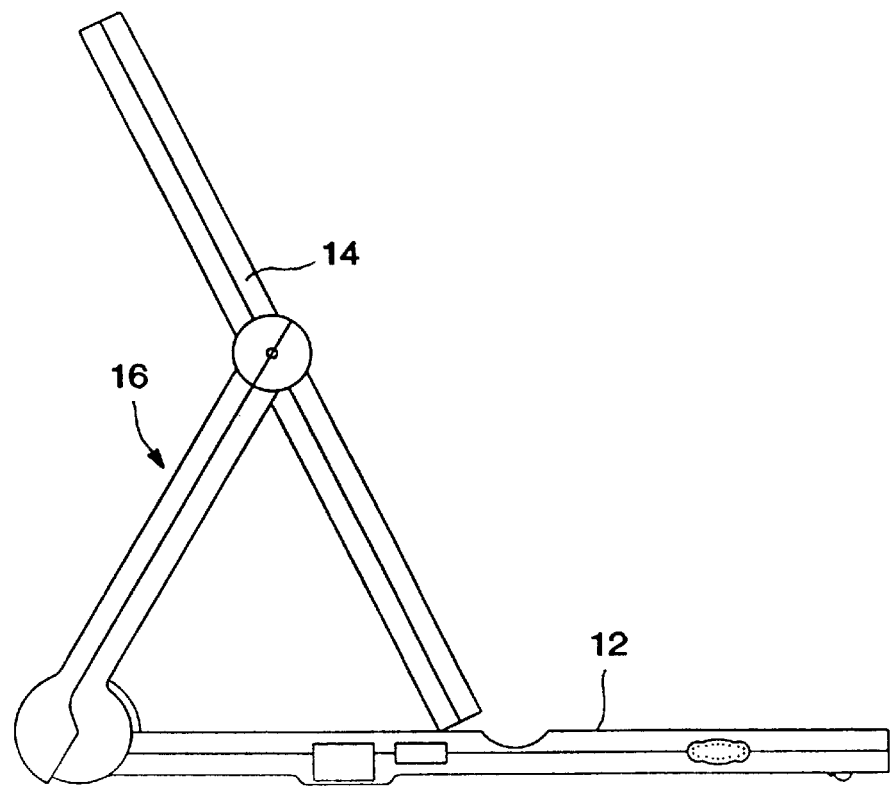
FIG. 7 is a first side views similar to FIG. 6, shown with the display in other positions.
Figure 8:
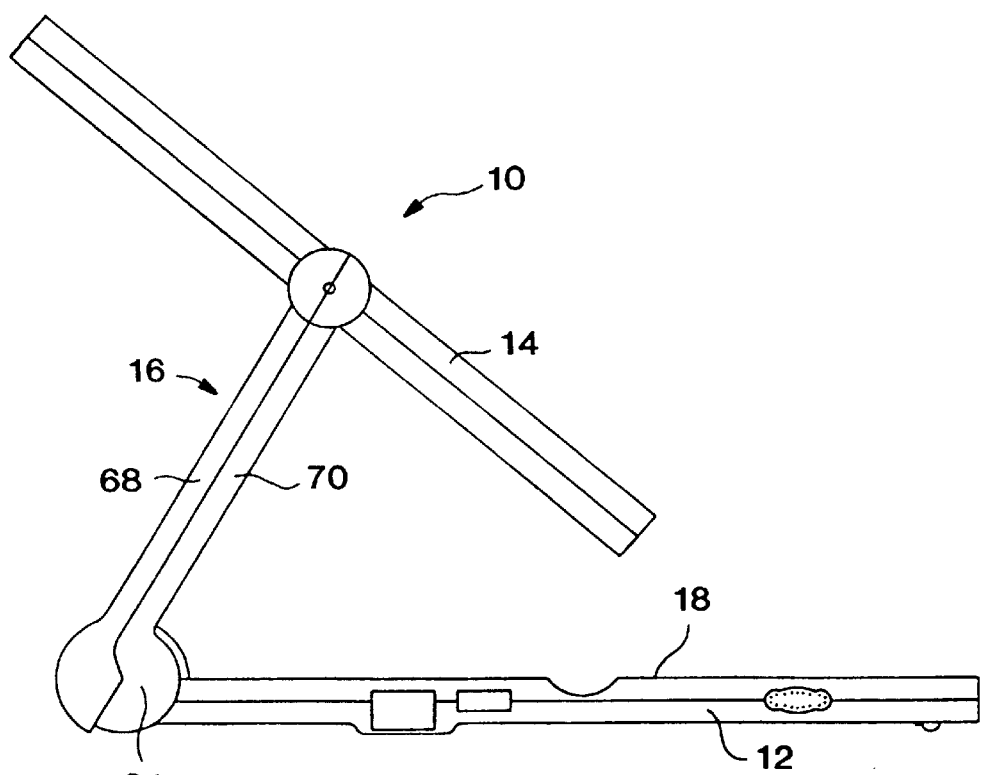
FIG. 8 is a second side view showing a side opposite that shown in FIG. 7.
Figure 9:
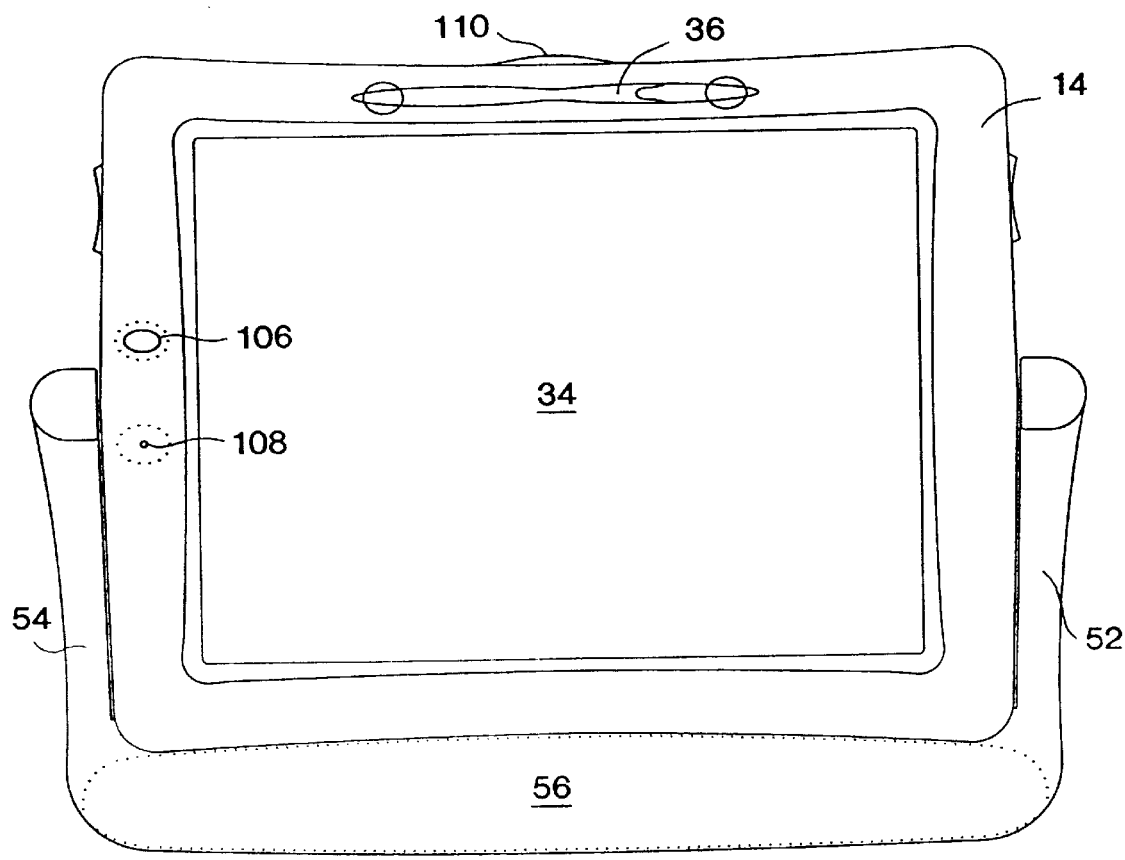
FIG. 9 is a top plan view of the computer of FIG. 4, shown with the display overlying the base in one tablet operating mode position.

The arm assembly or frame body 16 couples the display member 14 to the base 12 such that the display member 14 may be moved to a plurality of different positions. FIGS. 4–6, 7, and 9 show examples of open positions in which the display 14 is tilted at a viewing angle and the keyboard 26 is exposed for use. Both the height and angle of the display 14 relative to the base 12 may be adjusted. FIG. 8 shows an example of a position where the display 14 is suspended above the upper surface 18 of the base, allowing the display 14 to be oriented at an angle greater than 90° without significantly increasing overall footprint of the computer 10. FIG. 7 shows an example of another open position in which the lower edge of the display 14 rests on the upper surface 18 of the base. In this position, the display 14 does not increase the footprint of the computer 10. The ability to move the display to the positions shown in FIGS. 7 and 8 are of particular advantage in when operated in cramped conditions, such as while traveling on an airplane, or during a meeting or other circumstance where the computer 10 must be as unobtrusive as possible. In the illustrated embodiment, which includes a touch sensitive screen 34, the computer 10 may also be adjusted so that the screen 34 is exposed when the display 14 is lowered onto the upper surface 18 of the base 12 as shown in FIG. 9. In this position, the computer 10 functions as a notepad computer and data is entered entirely through the touch sensitive screen. This position is also referred to as the pen, stylus, or tablet mode configuration and is illustrated in a perspective view in FIG.

2. In one embodiment, the touch sensitive screen is configured to display a virtual keyboard such that areas of the screen display keys (such as the QWERTY pattern), and when touched transmit the letter, number, or other character to the CPU as if an actual keyboard were provided. This allows the touch sensitive screen to be used for graphical (stylus) inputs as well as keyboard inputs without changing the configuration of the computer. The available positions are not to be limited to those shown in the figures.

The U-shaped arm assembly or frame body 16 generally includes a pair of spaced lateral arm portions 52, 54 and a base or connecting portion 56 extending between the arm portions 52, 54. The upper ends 58 of the arm portions 52, 54 are pivotally coupled to the peripheral edge 33 of the display. In the preferred modification of the invention, the arms 52, 54 are coupled to the sides of the display at the approximate midpoint between the upper and lower edges of the display. With this configuration, the weight of the display 14 is balanced relative to the arm assembly 16 such that the display 14 may be easily supported at the selected angle relative to the arm assembly. However, it is to be understood that the position where the arm assembly 16 attaches to the display member 14 may be adjusted within the scope of this invention. In this embodiment, the display 14 may be moved from a zero position shown for example in FIG. 4, where the display is substantially parallel to the arm portions with the screen 34 facing forward, to a position flipped 180° from the zero position, with the display 14 parallel to the arm portions 52, 54 and the screen 34 facing rearwardly. Preferably, rotation greater than 180° from the zero position in either direction is prohibited to reduce stresses on the electrical connectors between the display member 14 and the base 12.

Figure 3:
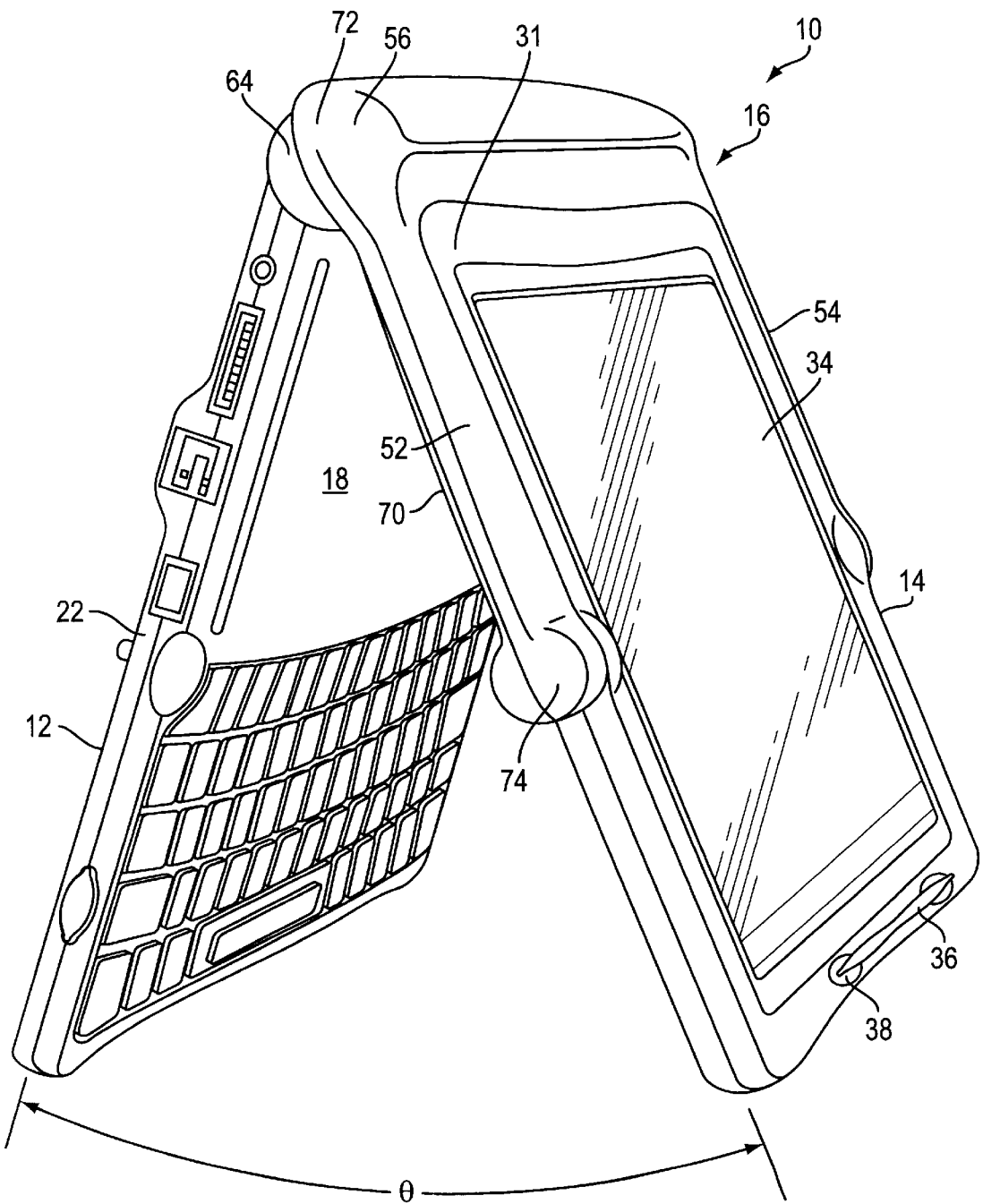
FIG. 3 is an illustration showing a perspective view of an embodiment of the inventive portable computer in a presentation mode configuration.
Figure 4:
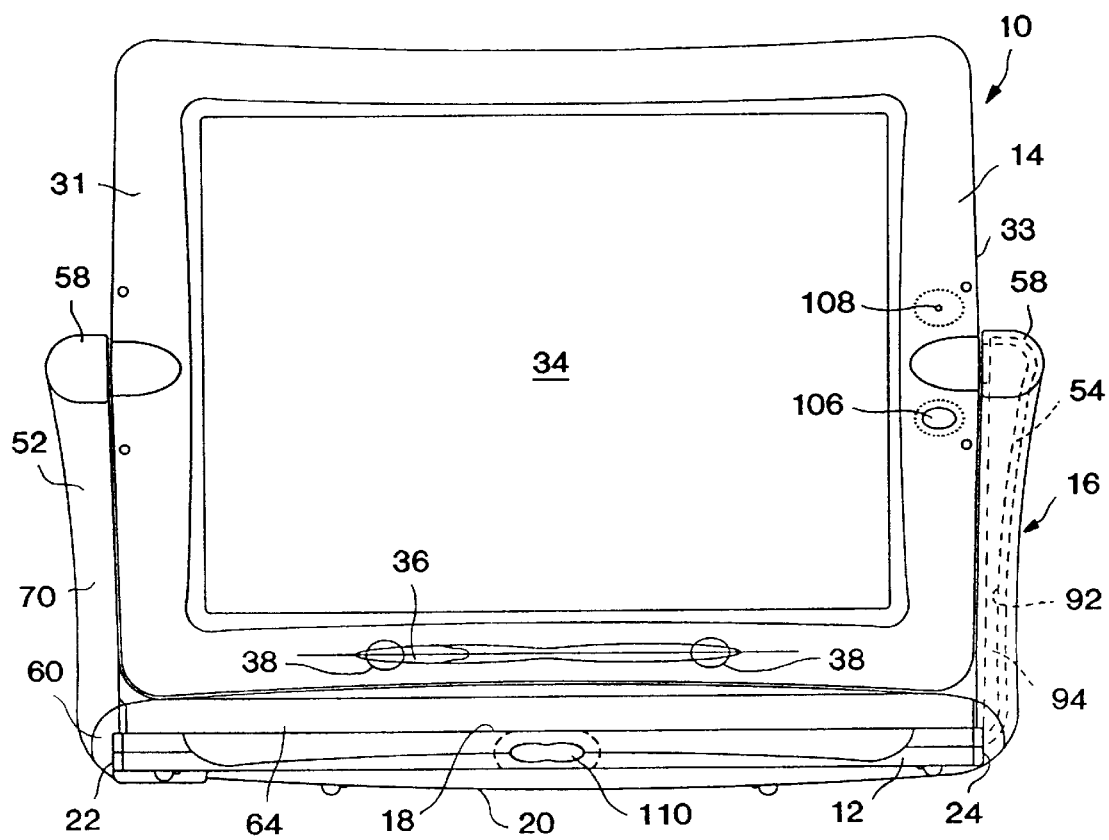
FIG. 4 is a front plan view of a portable computer constructed in accordance with the present invention, shown with the display in an open position.

This 180° flipped orientation provides a presentation mode configuration in which the base 12 and the display 14 are disposed at an angle θ (non-parallel and typically between about 10° and about 120°, but more usually between about 30° and about 90°) relative to each other and the front surface 31 of display screen 34 faces outward. While in this configuration, computer 10 may be placed on a supportive surface (such as a desk top, table, or the like surface) with the normally front edge surface of the peripheral edge joining the upper and bottom surfaces of base 12, and the normally upward (notebook mode configuration, See FIG. 1) or forward facing (tablet mode configuration, See FIG. 2) peripheral edge 33 of display 14 facing downward against the supportive surface. Resilient pads may optionally be provided at the contact points to cushion the contact and provide non-skip contact areas. This presentation mode configuration is illustrated in FIG. 3. Advantageously, flipping the display screen by 180° relative to the arm portions 52, 54 and at the same time flipping the computer 10 onto its front peripheral edges places the front surface of display screen 34 facing outward and in proper orientation for reading displayed text and graphics without any geometrical rectification or correction of the displayed information.

In one embodiment of the invention, lower ends 60 of the arm portions 52, 54 are pivotally coupled to the side edges 22, 24 of the base at the rear end portion of the base 12, and arm portions 52, 54 of the display frame body 16 are pivotally coupled to the display member 14, by friction hinges 72 and 74, as described in greater detail hereinafter. Desirably, the friction characteristics of the friction hinges 74 attaching arm portions 52, 54 to display member 34 are set differently from the friction characteristics of the friction hinges 72 attaching arm portions 52, 54 to base 12 so that friction hinges 72 have a lower friction coefficient and pivot more easily than friction hinges 74. This differential friction characteristic assists in maintaining display member 34 aligned parallel with arm portions 52, 54 when computer 10 is in presentation mode configuration, and substantially prevents display 34 from pivoting that might lead to the collapse of the computer onto the supporting surface. The manner in which this differential friction characteristic is achieved is described relative to a particular embodiment of the friction hinges elsewhere in the specification. These special friction hinges also provide desirable latchless opening and closing characteristics which are also described elsewhere in this specification.

In this presentation mode configuration, keyboard 26 is somewhat inaccessible for typing, however, as computer 10 is desirably provided with one or more of a touch sensitive screen, wireless modem, and infrared (IrDA) port, communication and control of computer 10 is still available. In addition, various wireless keyboards, mouse, cursor control, and outer pointing devices (some having integral programmable buttons) may be connected to computer 10 via an available serial port, parallel port, PC card slot, Universal Serial Bus (USB) ports, or the like.

The lower ends 60 of the arm portions 52, 54 are pivotally coupled to the side edges 22, 24 of the base at the rear end portion of the base 12. The base or connecting portion 56 extends along the rear end of the base. The rigid connecting portion 56 reinforces the arm assembly 16, providing stability and reducing torsional stresses during movement of the arm assembly 16. The arm assembly 16 rotates between a zero position, with the arm portions 52, 54 substantially parallel to the base, and a fully open position with the arms inclined at an angle relative to the base. In the illustrated embodiment, the arm portions are nominally oriented at an angle of between about 80° and about 100°, usually at between about 85° and about 90° relative to the base when the arm assembly 16 is in the fully open position. This configuration ensures the center of gravity of the display is always located directly above the base 12, increasing the stability of the open computer 10 by preventing the computer from falling backward. Retaining the center of gravity of the display over the base 12 is of particular advantage in the preferred embodiment of the invention, where the total weight of the computer has been minimized. Specifically, the weight of the display is about 1 lb to 1.2 lbs and the weight of the computer withhold optional disc drives is only about 2.6 to 3.0 lbs, depending on configuration and is less than about one (1) inch thick. However, it is to be understood that rotating the arm assembly more than 90° is within the scope of this invention, particularly in other embodiments of the invention where the base weighs considerably more than the display.

In the illustrated embodiment of the invention, the rear end portion of the base is formed with an enlarged rounded portion, generally designated 64. The connecting portion 56 has a generally concave cross sectional shape as shown by the interrupted lines in FIG. 4 which conforms to the shape of the rounded portion 64 of the base. As the arm assembly is rotated relative to the base, the connecting portion slides or rotates around the rounded portion of the base 12. In addition to facilitating manipulation of the arm assembly 16 between the zero position and the fully open position, the concave shape increases the rigidity of the connecting portion 56.

Figure 10:
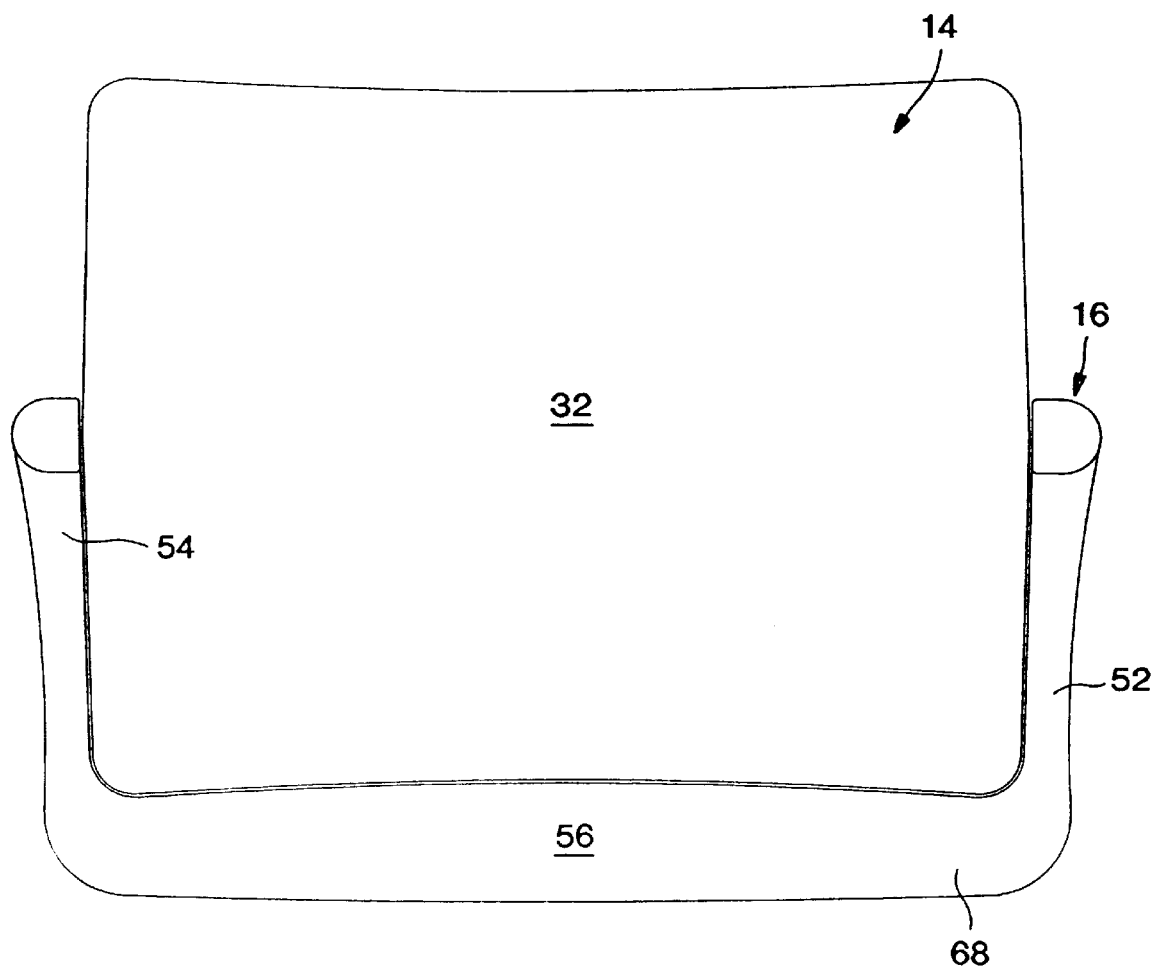
FIG. 10 is a view similar to FIG. 9, shown with the display overlying the base in a second closed storage or traveling mode position.

The arm assembly 16 of the illustrated embodiment includes a U-shaped rigid back member 68 including the back section of the arm portions 52 and 54 and the connecting portion 56 (FIG. 10). The arm portions 52 and 54 are completed by front members 70 which are secured to the back member 68 by screws or other suitable fasteners. The unitary back member 68 is preferably formed of a light weight metal such as aluminum for optimum strength. The front members 70 are formed of a plastic material reinforced by fiberglass or carbon fiber to reduce the overall weight of the arm assembly but still retain strength. However, the front members 70 may be formed of other materials including metals if desired. Moreover, the back member 68 may be formed of materials other than metal provided the material has sufficient strength to support the display member 14.

Figure 17:
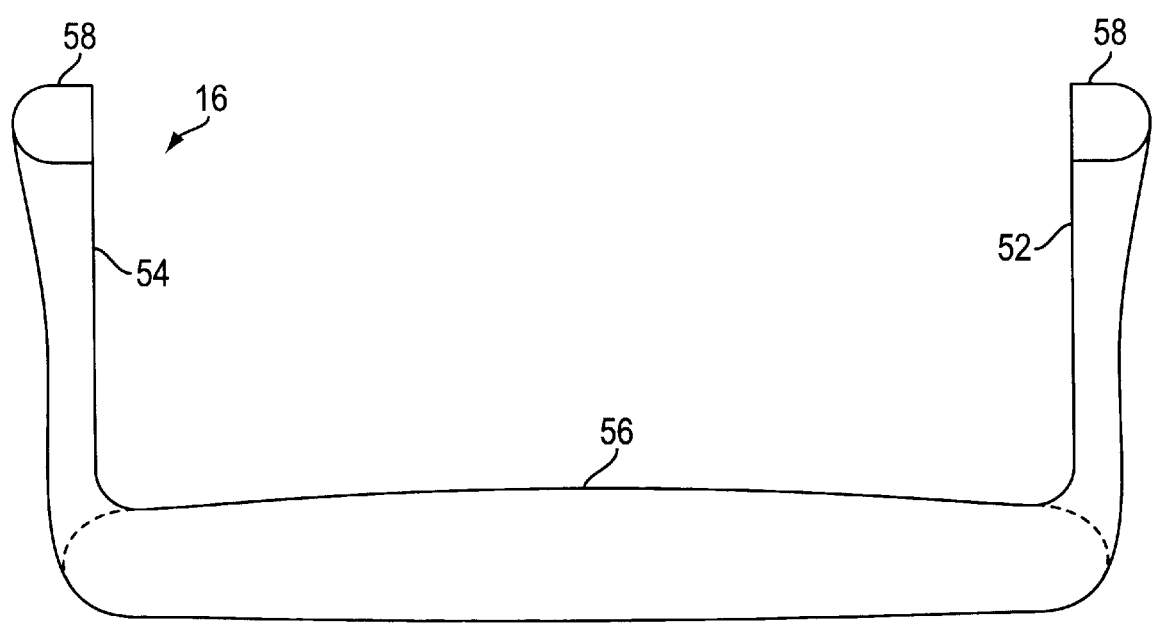
FIG. 17 is an illustration showing a plan view of the externally visible structure of an embodiment of the inventive arm assembly.

One particular embodiment of the arm assembly 16 is illustrated in FIGS. 17–20 which show certain visible external characteristics as well as certain internal structural and functional characteristics. FIG. 17 illustrates a plan view of the externally visible structure of an embodiment of the inventive arm assembly 16, including connecting portion 56 which partially houses hinges 74; arm portions 52, 54 one of which arm portions partially house wiring coupling electronics in base 12 with the display; and upper ends 58 of the arm portions 52, 54 which partially house hinges 74.

FIG. 18 is an illustration of the opposite (internal) side of the same arm assembly 16, while FIG. 19 (FIGS. 19a–19e) show several detail and partial sectional views of the arm structure in FIG. 18. For example, a first semi-circular ridge 171 in arm portion 52 that when mated to the mating front member 70 having a similar semi-circular ridge shape 172 forms (in one arm) a hinge mounting hole or passage through which a hinge mounted into the arm couples the arm 52 to the base 12. The other arm 54 is provided with a similar second semicircular ridge that when attached to its mating front member 70 forms a hole or passageway that coupled to internal conduit 92 in arm 54 which houses the electrical connectors 94 coupling the screen 34 to the components housed in the base 12 as also shown in FIG. 5. As described in greater detail hereinafter, the electrical connectors 94 are carried by a ribbon having particular characteristics and method of assembly to assure longevity and reliability in spite of repeated rotation of the display relative to the base.

FIGS. 19a–19e provide a series of partial sectional views through portions of arm assembly 16 so that the manner in which the hinges are mounted to the arm, the manner in which wiring and connectors are routed from the base through the arm 16 to the display, and especially the manner in which the connecting portion 56 has a generally concave cross sectional shape which conforms to the shape of the rounded portion 64 of the base 12, and which concave shape increases the rigidity of the connecting portion 56. Use of the rounded shape increases the strength and rigidity of the arm so that the connecting portion 56 as well as the arm portions 52, 54 which also have a concave section (See FIG. 19b), are much stronger, much more ridge, and much less prone to distorting while carrying the mass of the display than a comparable thickness of flat material. Therefore, while the concave connecting portion serves to increase strength, no space is wasted as the computer advantageously places the battery in the rounded portion 56 of the base.

FIG. 20 is an alternative view of the arm assembly from a viewpoint location indicated in FIG. 18 along the thin bottom edge (when in notebook configuration) or along the rear elevational profile when in the tablet mode configuration or the closed mode configuration. It is noted that the manner in which this view is described is dependent upon the mode in which the computer is configured because the arm rotates or pivots to different positions and orientations.

We note that in the embodiment providing friction hinges 72, 74 in only one arm 52, the strength and rigidity provided by the concave (somewhat tubular) shape of the connecting portion, is highly advantageous.

Figure 15:
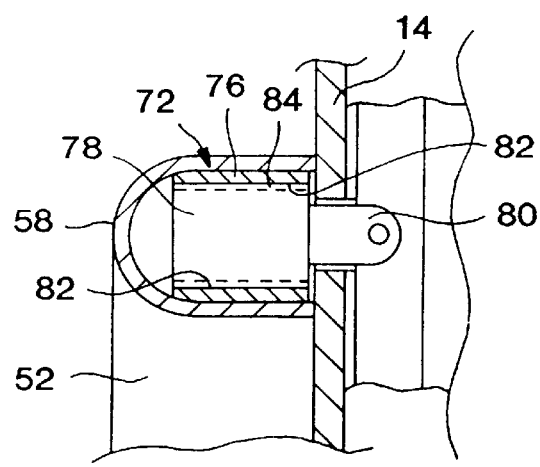
FIG. 15 is an enlarged sectional view taken substantially along lines 12—12 of FIG. 5.

Arm portion 52 of the frame body 16 is pivotally coupled to the display member 14 and base 12 by friction hinges 72 and 74. As shown in FIG. 15, one embodiment of the hinge 72 generally includes an outer sleeve 76 and a cylinder 78. The sleeve 76 is fixedly mounted to the arm portion 52, with a tab 80 projecting from the cylinder 78 extending into the display member 14. The tab 80 is mounted to the interior skeletal frame of the display member. The cylinder 78 is rotatable within the sleeve 76 upon application of sufficient force to the cylinder, through the display member 14 and tab 80, to overcome the frictional forces between the exterior of the cylinder 78 and the interior of the sleeve 76. Once the user has released the display 14, the frictional forces between the sleeve and the cylinder retain the display in the desired position.

In the present embodiment of the invention, the hinge 72 includes two locking positions, one corresponding to the zero position of the display member 14 and the other corresponding to the position flipped 180° from the zero position. When the display member 14 is in either of these positions, a greater force must be applied to the display member 14 to move the display member from the position. In this embodiment of the invention the inner surface of the sleeve 76 is formed with two grooves 82 while the exterior of the cylinder 78 has a projection or detent 84 thereon. The detent 84 seats in the grooves 82 when the display member is moved to the zero position and the 180° position, respectively. Between the two locking positions, the display member 14 is held in place by friction.

Figure 16:
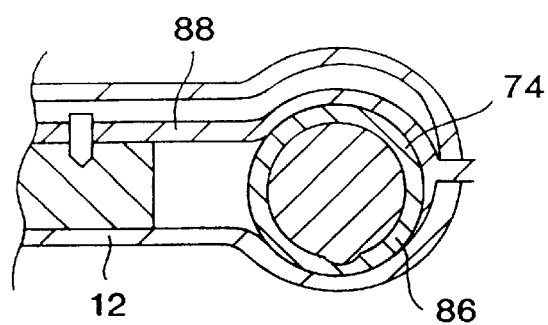
FIG. 16 is an enlarged sectional view taken substantially along lines 13—13 of FIG. 8.

Hinge 74 is similar to hinge 72 as shown in FIG. 16. The outer sleeve 86 of the hinge 74 is mounted to the base 12, while the tab projecting from the cylinder is mounted to the arm portion 52. In the present embodiment, the sleeve 86 is mounted to the base 12 by a metal band 88 which is mounted at one end to the base 12. The band 88 extends around the sleeve 86 and the other end of the band engages the rear edge of the base 12, with the band applying a compressive force to secure the sleeve 86 in a fixed position. Similar to hinge 72, hinge 74 includes two locking positions, one corresponding to the zero position with the arm portions 52, 54 substantially parallel to the base and the fully open position with the arm portions 52, 54 oriented at 90° relative to the base. As discussed above, the locking positions are defined by grooves formed in the interior surface of the sleeve 86 and a detent formed on the exterior of the cylinder of the hinge 74. The engagement between the detent and groove of the hinge 74 is sufficient to securely retain the display member 14 in the closed position with the arm members substantially parallel to the base. As the arm assembly 16 approaches the zero or closed position, with the detent approaching the edge of the groove, the detent has a tendency to move into the groove such that the display member 14 is snapped toward the base 12, facilitating closure of the computer 10. Thus, in the illustrated embodiment of this invention a separate locking mechanism is not provided. However, it is to be understood that a mechanism securing the display member 14 in the closed position may be employed if desired.

An alternative embodiment of the invention employs friction hinges of a somewhat different structure but similar function to that already described. These alternative friction hinges 72a, 74a are attached to the base 12, arm portions 52, 54, and display member 14 in the same manner as the first embodiment of friction hinge 72a, 74a. An exemplary embodiment of the alternative friction hinge 72 is now described relative to the illustrations in FIGS. 21–26.

Figure 21:
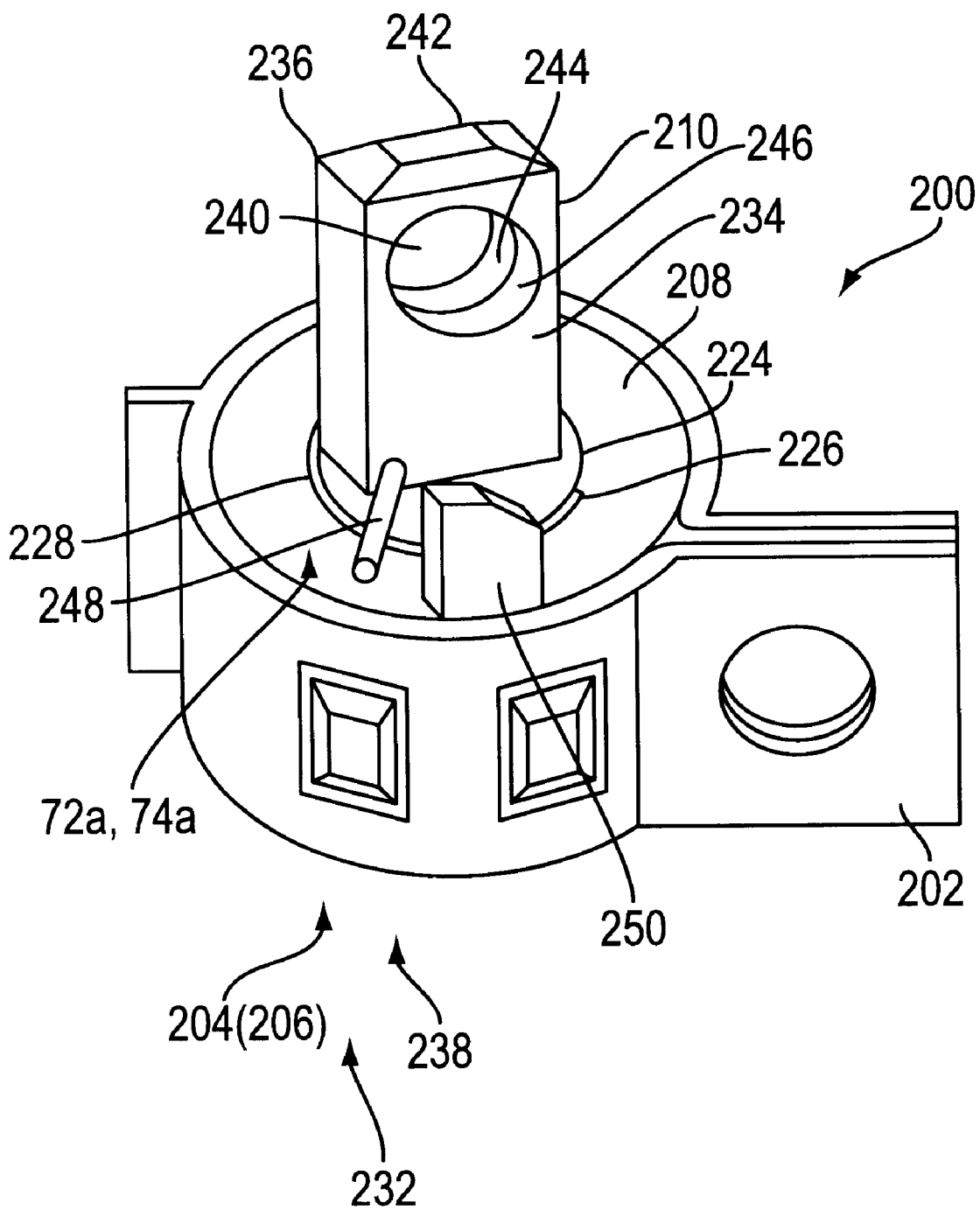
FIG. 21 is a perspective view of the alternative embodiment of a friction hinge.

In FIG. 21 there is illustrated a perspective view of the alternative friction hinge 72a, 74a. Friction hinge 72a is used to attach arm assembly 16 to base 12, and friction hinge 74a used to attach at least one of arm portions 52, 54 to the display member 14. They differ only in minor ways, for example, they are sized to provide somewhat different friction forces (and stiction when at a detent position), have somewhat different configurations of their respective outer generally cylindrical housing portion owing to the manner in which each is mounted to the computer, and have flat portions of the shaft located in different relative orientations owing to the desired different locations of the detent or stop positions. In other ways friction hinge 72a and friction hinge 74a are the same. We therefore confine our description to the common structural and functional features relative to FIGS. 21–26 and subsequently describe the differences in the two friction hinges 72a, 74a.

FIG. 21, we show an embodiment of the friction hinge (or friction bearing) 72a, 74a assembled to attachment band 202 to form what we refer to here as friction hinge assembly with attachment band 200. FIG. 21 illustrates external visible features of the friction hinge and attachment band. Internal features are subsequently described in greater detail relative to FIGS. 22–26. Friction hinges 72a, 74a comprises a generally cylindrical housing 204 having a closed end 206 and an open end 208, where the term closed end refers to the end of friction hinge housing 204 through which shaft 210 extends but which serves as a stop for first and second sets of flat springs 212, 214. The closed end of the housing closes one side of the chamber 220 that carries the first and second sets of flat or leaf springs, in the manner described in greater detail below.

The portion of shaft 210 which extends through housing shaft hole 224 proximate the closed end 206 of the friction hinge housing includes a circumferential slot 226 for receiving a C-clip 228 for maintaining shaft 210 within housing 204. A similar circumferential slot 230 and C-clip 232 (as well as a brass washer 238) are provided at the opposite end of shaft 210, so that in combination they maintain the shaft within the housing yet allow it to freely rotate. The shaft 210 also desirably includes opposed flat mounting portions 234, 236 and a shaft attachment whole 240 proximate shaft attachment end 242 and extending through shaft 210 to connect with flat portions 234, 236 to facilitate mounting the shaft portion of friction hinges 72a, 74a with a screw, pin, pedestal, post, or other fastener or fastening means to a mounting surface.

In one embodiment of the inventive friction hinge, shaft attachment hole 240 is stepped to provide a through hole portion 244 for a screw thread portion and a shoulder portion 246 that mates with the cap portion of the screw but which prevents the cap from passing through the hole. The cap portion of the screw is therefore recessed into the shaft after being fastened to reduce the volume and physical size of the assembly. A pin 248 extending into shaft 210 may optionally be provided to rotate with shaft 210 and to stop rotation of the shaft at a predetermined rotation angle where pin 248 encounters a stop protrusion 250 extending from the housing. In the embodiment illustrated in FIG. 21, the housing is formed from a metal and the stop protrusion is formed integral with the housing. The angular location of pin 248, protrusion 250, and spring detents (shaft flat portions internal to the housing) are selected to provide the desired range of motion and predetermined stop positions (for example, the zero position and the closed position).

Figure 22:
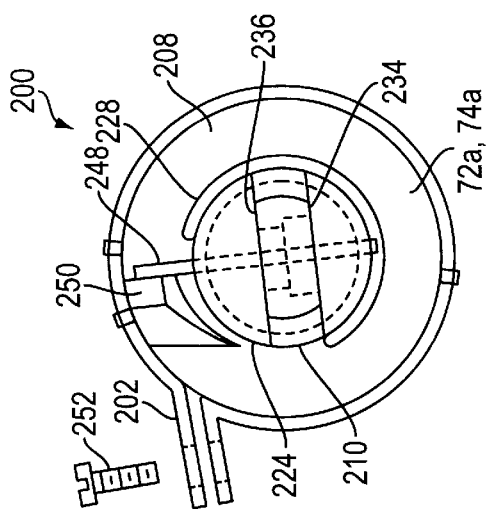
FIG. 22 is an end view of the friction hinge assembly of FIG. 21.

In FIG. 22 is shown an end plan view of the friction hinge assembly with attachment band 200. This illustration generally shows the same structures as illustrated in FIG. 21, but from a different viewing position. A screw 252 for attaching the attachment band 202 is also illustrated in FIG. 22.

Figure 23:
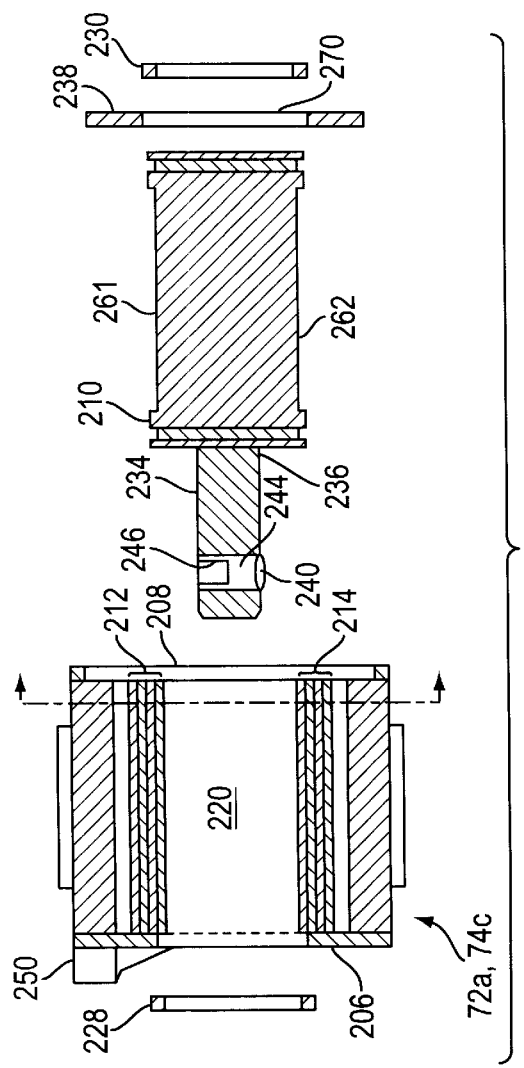
FIG. 23 is an exploded assembly drawing in partial sectional view of the friction hinge in FIG. 21.

In FIG. 23 is shown an exploded assembly drawing in partial sectional view where the cut line for the view is along the longitudinal axis of shaft 210. In this illustration are apparent the two sets of flat or leaf springs 214, 214, here consisting of four springs per set, but in general the number, thickness, and material properties (including spring constant) for the springs are chosen to provide the desired hinge properties. Each flat or leaf sting is desirably formed from a spring steel type material so that they do not deform from use or take on a positional or shape set when stored for an extended period of time in a static position. Also shown in FIG. 23 are first and second inner flat portions 261, 262 that ride in contact with springs sets 212, 214 to provide the stop or detent function, which is more readily explained relative to FIGS. 24–26. Housing 208 includes an internal chamber 220 that carries the first and second sets of flat springs 212, 214 and accommodated shaft 210. Shaft 210 is centered and held in place within the housing 208 and chamber 220 by the hole 224, washer 238 and washer hole 270 centered there within, and C-clips 228, 230. Chamber 220 includes a central portion 271 through which shaft 210 passes and first and second opposed spring chambers 272, 273, each spring chamber having a substantially rectangular slot for receiving and holding the leaf spring sets 212, 214 and a domed ceiling portion for accommodating movement of the central portion of the springs 212, 214 when they are deformed radially outward from the shaft 210 as the shaft rotates. The manner in which the springs are elastically deformed to provide positional stability with movement and detents is now described relative to FIGS. 24–26

Figure 26:
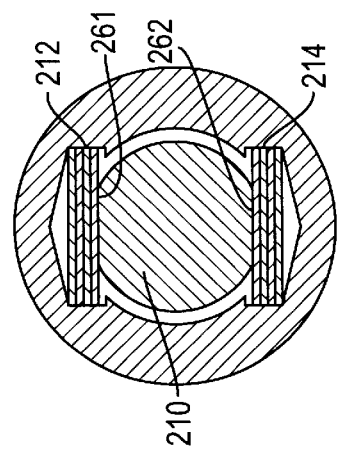
FIG. 26 is an illustration showing a detent position of the friction hinge of FIG. 21 in which flat portions of the hinge shaft are aligned adjacent to the leaf springs to provide a latching action.
Figure 25:
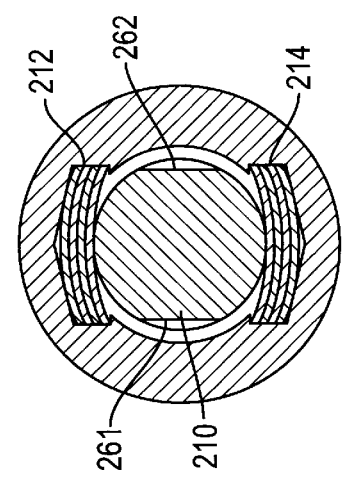
FIG. 25 is an illustration showing a non-detent position of the friction hinge of FIG. 21 in which flat portions of the hinge shaft are not aligned adjacent to the leaf springs and the hinge is able to rotate with an applied friction force against the round portion of the shaft.
Figure 24:
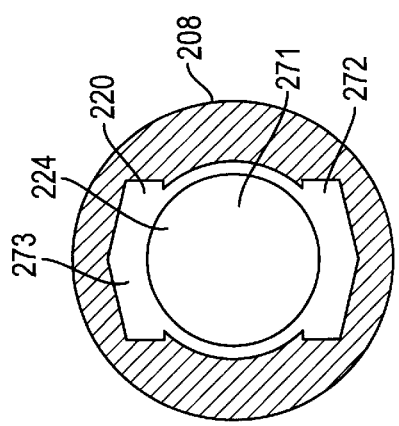
FIG. 24 is an end view illustration of an open end of the friction hinge housing showing the domed or peaked ceiling portion of the chamber that is sized to carry first and second sets of flat or leaf springs.

FIG. 24 is an end view illustration of the open end of housing 204 showing chamber 220 including the domed or peaked ceiling portion that is sized to carry the first and second sets of flat or leaf springs. Shaft 210 includes two opposed flat surfaces 261, 262 cut into the cylindrical shaft. The cylindrical shaft diameter, the depth of the flat shaft portions 261, 262, and the locations of leaf springs 212, 214 are selected such that when the flat portions 261, 262 are not aligned adjacent to the leaf springs (FIG. 25) the leaf springs contact the cylindrical portion of the shaft and exert a generally radially inward force against the shaft, resulting in friction between the shaft and the springs. The shaft 210 and elements of the computer attached to it are held in position by this friction force (arrows with "F"). The curved desirably lubricated, contact surface provide smooth relative motion between the shaft and the springs. However, when the shaft is rotated such that the flat portions 261, 262 of shaft 210 begins to contact the springs 212, 214, the shaft is urged to continue rotating until the flat portions 261, 262 are aligned with the springs 212, 214 as illustrated in FIG. 26. Once aligned with the leaf springs, the shaft tends to stay aligned until a greater force is applied to move it off the flat stop or detent position. While only two flat portions 261, 262 and two sets of springs 212, 214 are provided in this embodiment, other embodiments of the friction hinge (or friction bearing) may b provided with fewer (e.g. 1 flat portion and 1 set of leaf springs) or a greater number of flat portions and/or leaf springs. Furthermore, the number of leaf spring sets need not be the same as the number of flat portions on the shaft, in fact, detents having different force levels may be provided by adjusting the relative number of leaf spring and shaft flat contact surfaces.

Having described this alternative embodiment of the friction hinges 72a, 74a, we now return to a description of the manner in which the friction characteristics of the friction hinges 74 attaching arm portions 52, 54 to display member 34 are advantageously set differently from the friction characteristics of the friction hinges 72 attaching arm portions 52, 54 to base 12 so that friction hinges 72 have a lower friction coefficient and pivot more easily than friction hinges 74. As described, these differential friction characteristic assists in maintaining display member 34 aligned parallel with arm portions 52, 54 when computer 10 is in the presentation mode configuration and in permitting the computer to be opened to the first stop position in which the arm is at substantially a vertical position relative to the base, before the display readily rotates into the desired viewing angle. To understand this operation it is only necessary to recall that the magnitude of the friction force on the shaft of hinge 72a and on the shaft of hinge 74a may be adjusted by changing the diameter of the shaft, the depth of the flat portions of the shaft, and the number and stiffness of the leaf springs. Normally, adjustment of the leaf spring stiffness is sufficient to achieve the required differential friction characteristics. In the exemplary embodiment of the computer, the friction hinge attaching the arm to the display has greater friction than the friction hinge attaching the arm to the base so that until the computer is opened the display screen naturally stays aligned with the arm, allowing the user to adjust the screen angle after the arm has reached its opened and stop position. The stop positions of the two friction hinges are also advantageously set to facilitate this substantially independent adjustment of the arms relative to the base and the display relative to the arms.

In the preferred form of the invention, one of the arm portions is provided with both hinges 72, 74 (or 72a, 74a). In the illustrated embodiment, the left arm portion 52 is provided with the hinges. However, it is to be understood that the hinges may be moved to the right arm portion 54 if desired, and the conduit 92 for the electrical connectors including wiring, cabling, or ribbon moved to the left arm portion. With the hinges located in arm portion 52, the other arm 54 is provided with an internal conduit 92 which houses the electrical connectors 94 coupling the screen 34 to the components housed in the base 12 as shown in FIG. 5. In the illustrated embodiment, the electrical connectors 94 are carried by a ribbon as is known in the art. The ribbon 94 is threaded through a path which minimizes the stresses exerted on the ribbon during rotation of the arm assembly 16 relative to the base 12, and rotation of the display member 14 relative to the arm member. As the ribbon enters the arm portion 54 from the display member 14, a complete loop (not shown) is formed in the ribbon. The loop selectively becomes tighter and looser as the display 14 is pivoted relative to the arm portion 54, preventing the electrical connectors 94 from crimping. Similarly, instead of feeding the ribbon in a direct path from the arm portion 54 to the base 12, a second loop (not shown) is provided before the ribbon enters the base 12. This loop also reduces stresses on the ribbon during manipulation of the arm assembly 16.

The manner in which the arms 52, 54, base 12, friction hinges 72a, 74a, electrical connector(s) 94 in the form of a ribbon cable having stress relieving loops 96, 96, display internal mounting bracket 115, and display 14 operate to provide advantageous operability is now described with respect to FIGS. 27–31.

Figure 27:
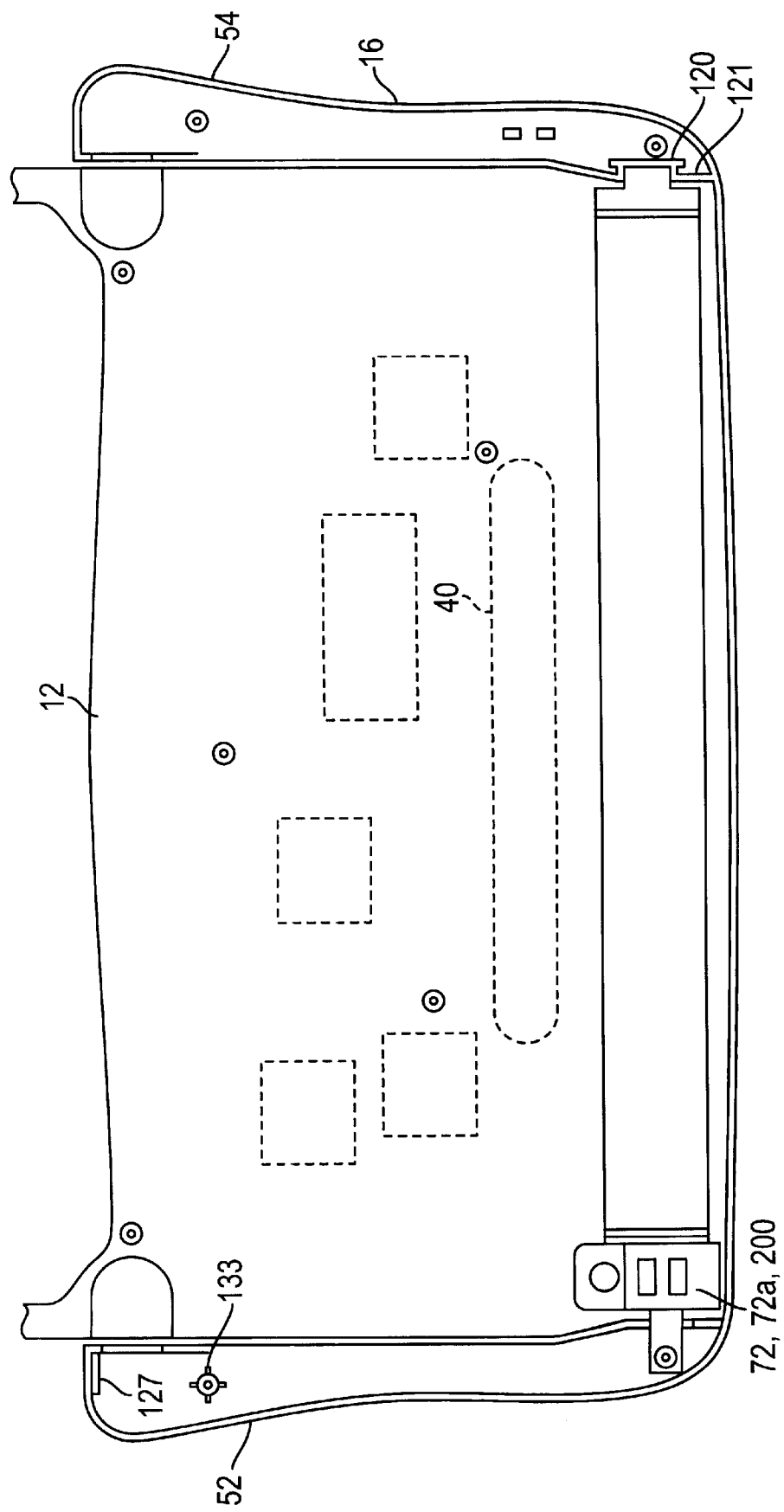
FIG. 27 is an illustration showing some internal structure of the arm assembly assembled to a portion of base with a friction hinge.
Figure 31:
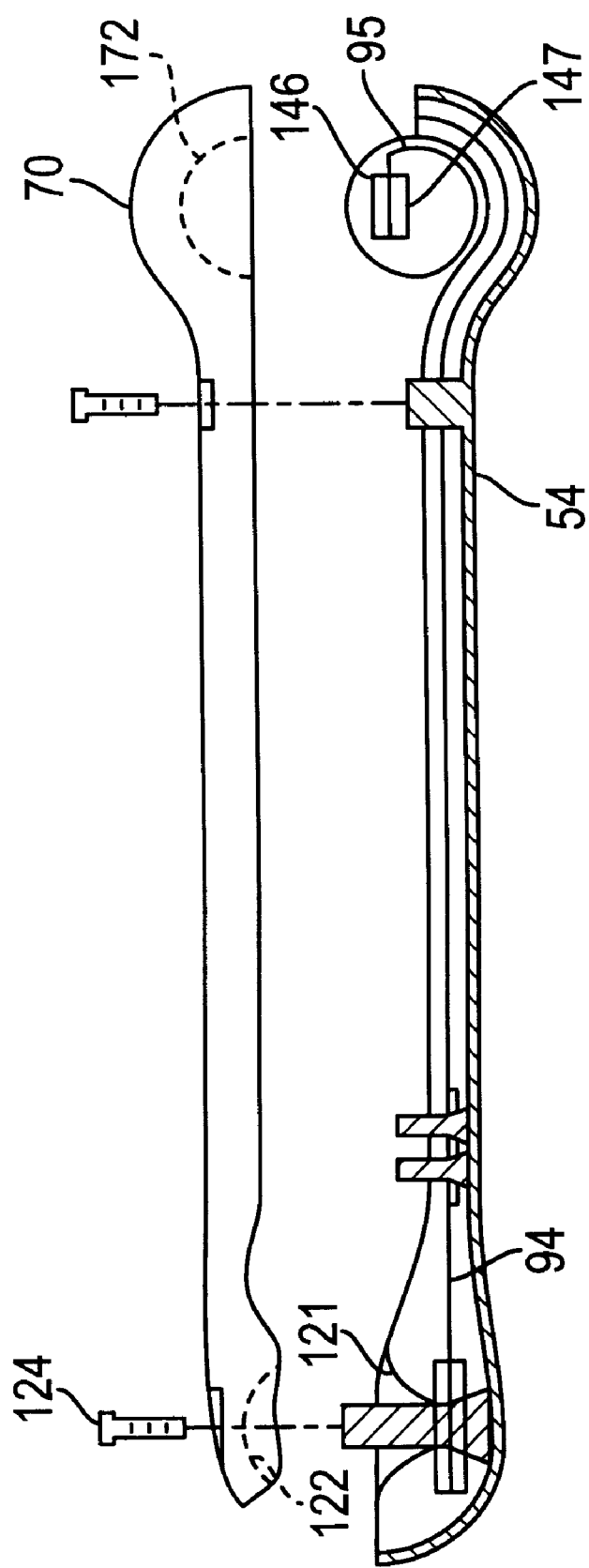
FIG. 31 is an illustration showing a partial seconal view down the longitudinal axis of arm and further showing the manner in which a ribbon cable connector is routed from the base, into the arm, and from the arm into the display housing.

In FIG. 27 is shown some internal structure of arm assembly 16, assembled to a portion of base 12 with friction hinge 72, 72a and to a much lesser extent with a loose fitting bell-shaped sleeve 120 that extends from base 12 into a substantially round hole 92 forming a conduit formed by two mating semi-circular ridges 121, 122 formed in arm 54 and arm front members 70 which are secured to the back member 68 by screws 124, snapfit mating notches, adhesive, or other suitable fastener or fastening means. The manner in which arm back and front members 68, 70 are aligned and attached, as well as an embodiment of the structure and method for routing a ribbon cable through the hollow interior cavity of the arm is illustrated in FIG. 31. It is noted that the base is connected to the arm only by friction hinge 72a (or 72) and that the generally bell-shaped sleeve having a flared end serves structurally only to align arm 54 to the base and to provide a conduit for the ribbon cable.

Figure 28:
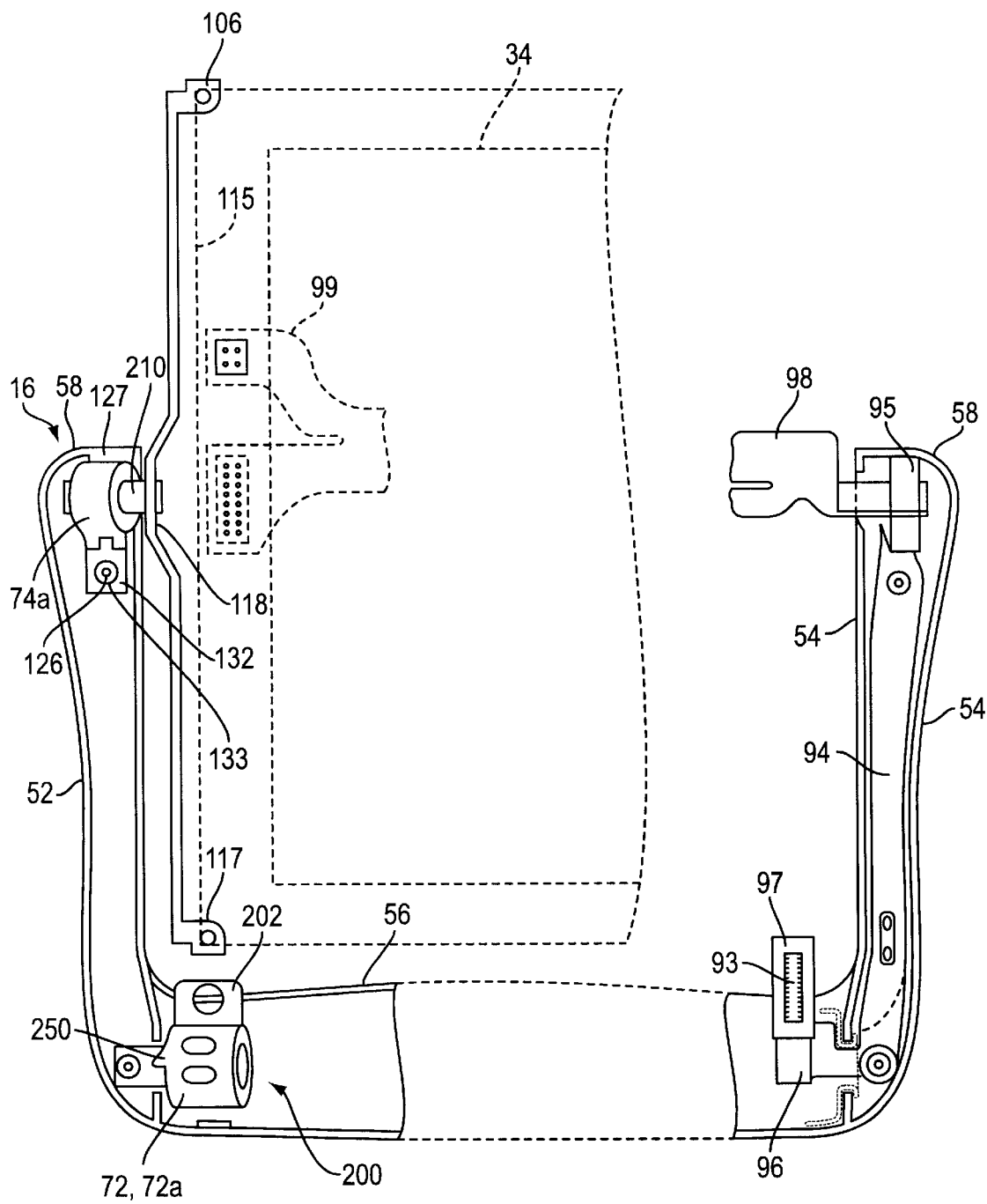
FIG. 28 is an illustration showing a more detailed view of the manner in which an embodiment of the friction hinge is attached to the display support arm by a screw and the combination of mating arm protrusion and friction hinge notch.

FIG. 28 provides a more detailed view of the manner in which friction hinge 72a is attached to arm 52 by screw 126, and the combination of mating arm protrusion 127 and friction hinge notch 128. The outer housing surface of the hinge incudes a notch 128 that fits under a protrusion or lip 127 extending internally from the edge of arm 52 proximate cup 130 such that when the hinge 72a is dropped into the cylindrically shaped cup 130 the protrusion 127 mates and latches with notch 128. When a screw or other fastener 126 is inserted through hole 131 and tightens housing attachment arm 132 of the friction bearing to a threaded receiving hole 133 in a post 134 in arm 52, the friction bearing is held tightly and prevented from moving in any direction, thereby providing a strong and stable structure to hold the display 34 via the display internal mounting bracket 115. The attachment structure is fast during assembly and self-aligning during assembly and use.

Display 34 is attached to arm 52 by a shaft 210 of friction hinge 74a and display internal mounting bracket 115 clamped (or tight press fit) to shaft 210. Bracket 115 is a generally linear, preferably steel, member having a notch 135 sized to receive a keyed end of shaft 210 so that bracket 115 does not rotate relative to the shaft but the shaft can rotate within housing 208 in the manner already described. Bracket 115 has a taped mounting pad 116, 117 at each end that provides a surface to which a display panel is attached by screws (not shown). Arm 52 is advantageously formed of a metal, such as cast aluminum, to provide the requisite strength and stiffness to carry the weight of the display.

Figure 29:
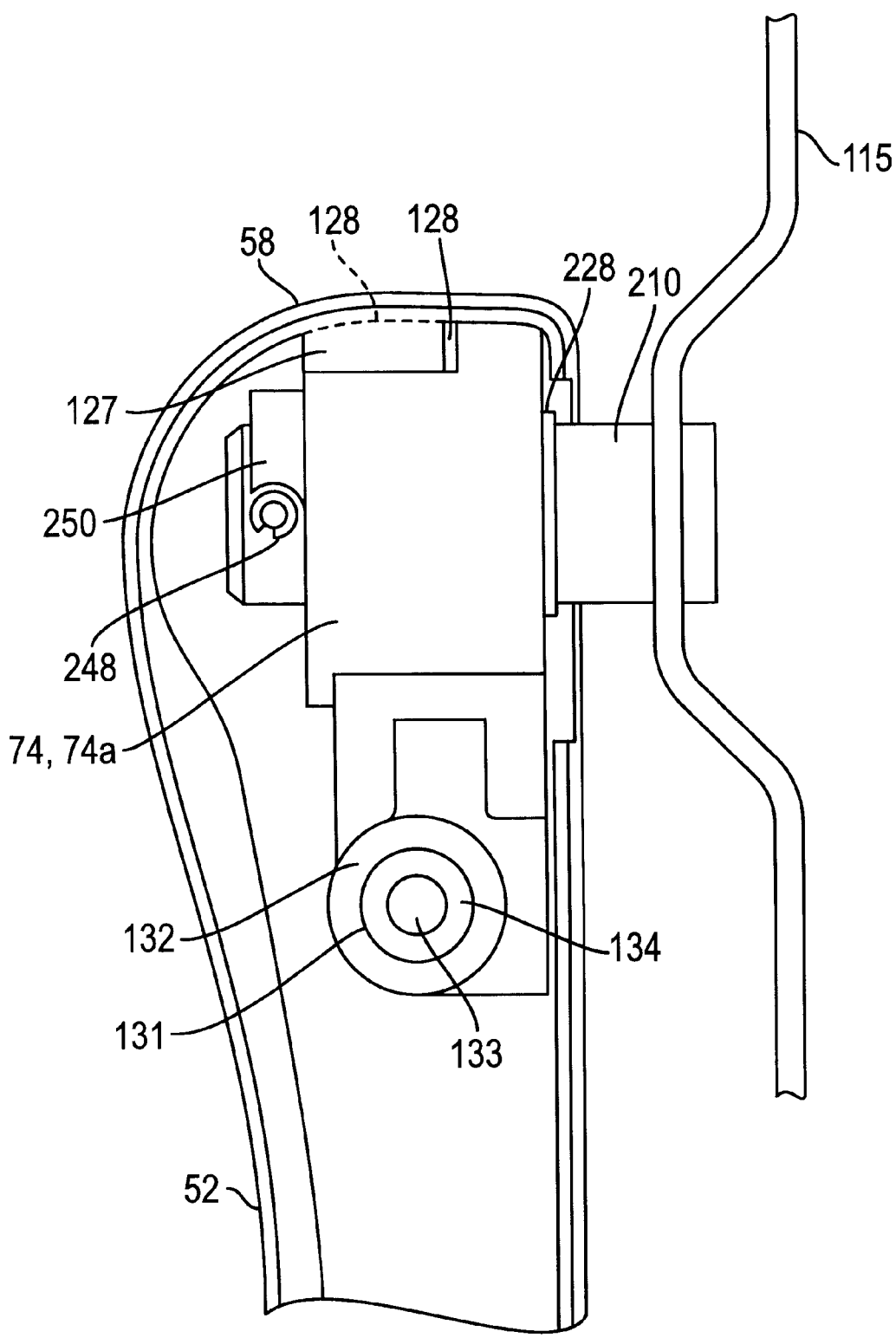
FIG. 29 is an illustration showing details of the manner in which an embodiment of the friction hinge is attached to the arm and to a display mounting bracket.
Figure 30:
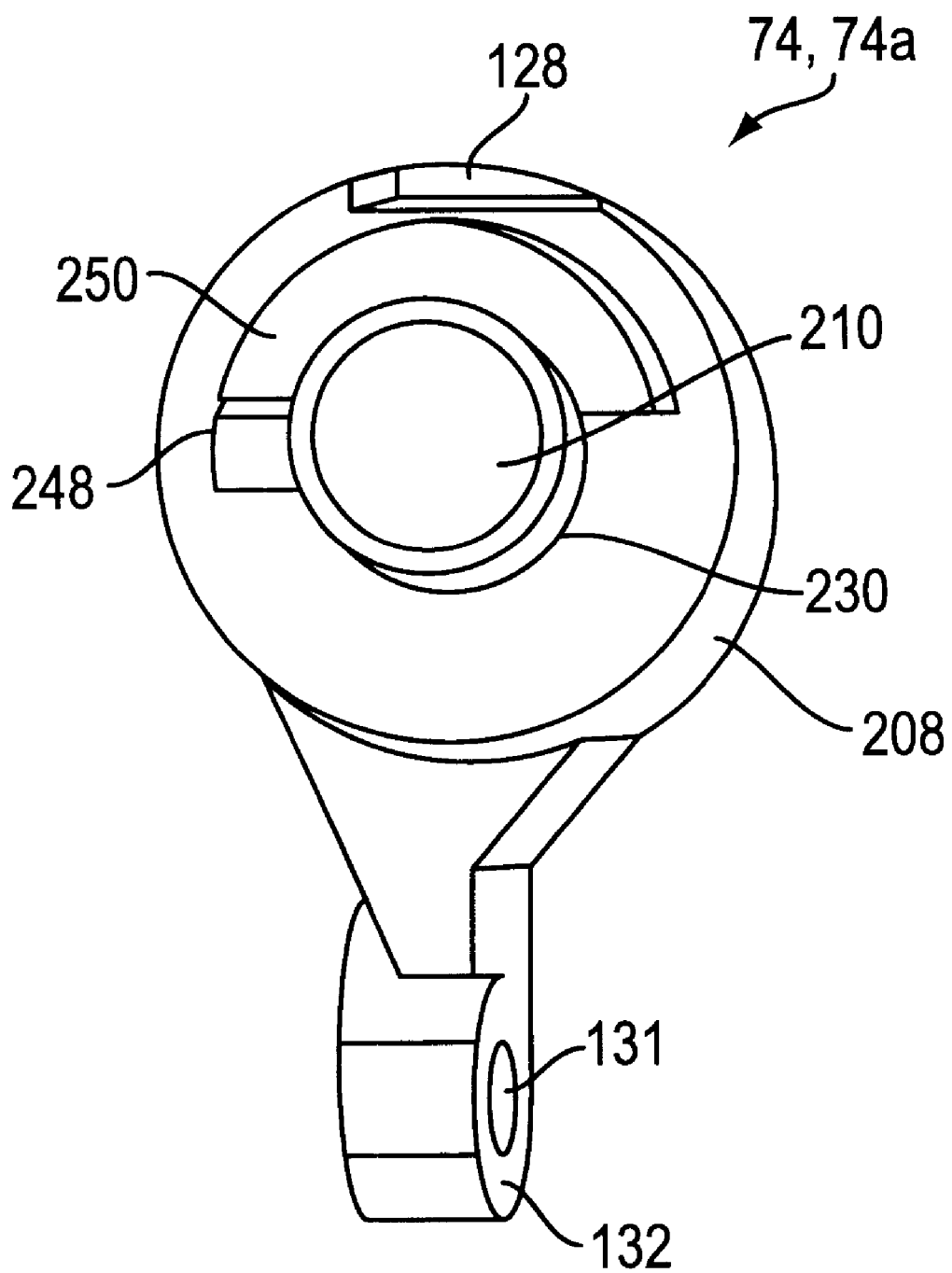
FIG. 30 is an illustration showing an alternative view of an embodiment of the friction hinge for attaching the display to the arm.

Friction hinge 72a is shown in FIG. 28 connected to a post (not visible in the drawing) with a screw 142 through shaft attachment hole 240. The manner in which friction hinge 72a connecting the arm to the base is illustrated in FIG. 27 but not in FIG. 28, as the base 12 is not shown in FIG. 28. Additional views of friction hinge 72a are illustrated in FIG. 29 which shows a detail of the attachment of the hinge to arm 52 and to bracket 115, and in FIG. 30 which shows a end view perspective of the same hinge.

With further reference to FIG. 28 and FIG. 31, we now describe the manner in which ribbon connector 94 is routed from base 12 containing electronics that generate signals for display, through the arm to the display screen. A first end of ribbon 94 disposed within the base and connecting portion of the arm has a connector 93 having a plurality of pins for receiving electrical signals. Ribbon 94 is curled into a first loop or coil 96 just prior to passing through conduit or hole 92 extending between the base and arm 54. The looping of the ribbon distributes the amount of bend or flex in any short segment of the ribbon that may otherwise contribute to wear or other stress induced failure. The coiling also maintains the ribbon within a small volume so that it does not generally touch the walls of the base or arm. As the arm is pivoted about the base, the diameter of the first loop 96 shrinks and enlarges to accommodate the movement.

Ribbon 94 is glued or otherwise adhered to a support including a stiffener and a rubber grommet that holds the stiffener and the ribbon to an alignment post which is also threaded and serves as an attachment location for cover 70. The stiffener may be formed from a small piece of printed circuit board type material and is advantageous in that it is provided with a hole that slips over the post to hold it in position, thereby reducing residual stress on the ribbon itself that may occur during assembly or from use. The rubber grommet further reduces stress and the possibility of wear. A second hole is provided in the ribbon in the upper portion or arm 54 to align with a second post, which also is threaded to receive a screw to hold the cover 70. Between the alignment holes and posts, the ribbon is folded along its length to reduce its width while still providing the desired number of conductive lines or traces. Folded portions are formed on a mandril having a predetermined minimum radius to prevent actual creasing of the ribbon, and taped to hold that radius. The ribbon also advantageously uses double-sided conductive lines that are one-half the thickness conventionally used so improve flexibility and reduce the chances of cracking that may accompany double-sided ribbon cables used in a flexible environment. Additional but optional alignment pins are provided within the arm to assist in assembly and prevent movement of the ribbon against the inner walls of the arm.

A second loop 95 is formed in the upper portion of the arm so that stress and wear that might otherwise result from frequent pivoting of the display is virtually eliminated. The manner in which second loop 95 is formed is better illustrated in FIG. 31, which shows a partial seconal view down the longitudinal axis of arm 54. In this particular embodiment, second loop 95 has almost two complete loops; however, more or fewer loops may be provided, for example even one loop will provide some of the stress reducing benefits described herein. Loop 95 also includes resilient pads 146, 147 adhered to each side of the ribbon in the region interior to the loop as the loop passes from the loop out of the arm and into the display. These optional pads advantageously prevent adjacent portions of the ribbon from touching and also provide some stiffening as the ribbon undergoes a right-angle turn and pass from the arm into the display. The ribbon 98 then expands after entering the display to connect with one or more connectors at a terminus of the ribbon to connect with electronic devices and circuits associated with operation of the display itself. Having described them manner in which the ribbon is routed from the base to the display, it will be understood that conventional wires may be routed via the same path, either with the ribbon or replacing the ribbon.

The computer 10 includes a battery (not shown) for supplying power for the computer 10. As is known in the art, the computer 10 preferably also includes AC adaptor port for supplying power without using the battery. The battery is preferably a lithium ion rechargeable battery, although the use of other types of batteries is within the scope of this invention. The battery is positioned in the rounded portion 64 of the base 12 such that the pivot axis extends through the battery. With this configuration, the overall size of the computer may be reduced. The battery is removable through the door 21. The battery is held within the battery compartment of the base by prongs (not shown) extending from the opposite ends of the battery. When in position, electrical contact is made between contacts on the battery and connectors which are coupled to the printed circuit board within the base 12 (not shown). Power conservation features to maximize battery life are advantageously implemented such as those disclosed in U.S. Pat. No. 5,396,635 and co-pending patent applications Ser. Nos. 08/767,821; 08/459,341; 08/460,078; and 08/458,189; which are incorporated by reference herein.

The computer 10 of the illustrated embodiment is automatically turned on for operation when the display 14 is lifted from the closed position overlying the base 12. This effect is achieved by a number of sensors which cooperate to identify the position of the display relative to the base. A first sensor 102 is provided on the upper surface of the base 12 to signal when the display member is in a position overlying the base. The display may be in one of two orientations when overlying the base. The base includes a second sensor 104 to determine when the display is in the closed position, with the screen 34 facing the base 12. In the illustrated embodiment, the sensor is positioned in the recess 40 where it detects the presence of the clip retainer, indicating that the display is in the closed position and the screen is facing downwardly. When these conditions occur, the computer 10 is turned off. When the sensors 102 and 104 detect that the display has been moved from the closed position, the computer is automatically activated to the "on" condition. In this context, ON may mean that power is ON and that the CPU is operating in an active state, while OFF may mean that the computer is in some reduced power state such as in hybernation mode, sleep mode or the like power conservation mode. OFF may also mean that the computer is completely turned off. An advantage of eliminating disc drive in some embodiments is the virtually instant start up associated with loading operating system and applications from ROM. The memory door 19 and the battery door 21 also include sensors (not shown) which senses whether or not these doors are open so that a predetermined operating mode may be invoked or retained depending on the sensor condition. For example, if the memory door or battery door are open, the computer will remain OFF or in some hibernation or sleep mode. Sensors may also be provided to inform the computer of the orientation of the display so that the display screen and operating condition may be controlled accordingly. Sensors may be contact type or contact less, including such known devices as microswitches, magnetic switches, LED/photodiode sensor pairs, and the like. Logic circuits query the conditions of the switches and provide inputs to the CPU or other logic means to control or modify operation.

To allow the user to manually turn off the computer 10, the computer includes an on-off switch 106 located on the front surface 31 of the display 14. An indicator light 108 provides a visible signal indicating the on/off (operating/non-operating) condition of the computer 10. An alarm light 110 is also provided to alert the user to various conditions. For example, the computer 10 may include scheduling software with the indicator alerting the user of a scheduled appointment or meeting. Although not included in the illustrated embodiment, the computer 10 may include a pager, with the alarm light being activated to notify the user of an incoming message. If a wireless modem is provided, the alarm light may also be used to notify the user of an incoming electronic message.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A portable computer comprising:
a base having an upper surface, a bottom surface and a peripheral base edge joining said upper surface and said bottom surface, said upper surface including a keyboard;
a display member having a front surface including a screen for displaying information, a back surface, and a peripheral display edge joining said front surface and said back surface;
an arm assembly coupling said display member to said base, said arm assembly including a pair of spaced arm portions and a rigid connecting portion extending between said arm portions, said arm portions each having a first end pivotally coupled to said base edge for movement of said arm assembly between a closed position with said arm portion substantially parallel to said base and an open position with said arm portion oriented at an angle relative to said base, said arm portions each having a second end pivotally coupled to said display edge for pivotal movement of said display member relative to said arm portion to move said display member between a plurality of positions relative to said arm portions;
a first hinge device pivotally coupling said first end of a first one of said arm portions to said base;
a second one of said arm portions having a conduit formed therein, and
a flexible printed circuit having a plurality of electrical connectors formed thereon and positioned in said conduit for electrically coupling said display member to said base, said flexible printed circuit having a shape including a coiled portion disposed within said conduit and first and second uncoiled portions extending in either direction from said conduit, said coiled portion winding and unwinding as the orientations of said arm portions change.

2. The portable computer of claim 1 in which said connecting portion is positioned adjacent said base, said connecting portion sliding relative to said base as said arm assembly is moved between the open position and the closed position.

3. The portable computer of claim 1 in which said connecting portion has a concave cross-sectional shape.

4. The portable computer of claim 1 in which said hinge device is configured for rotation of said arm portion between the closed position and the open position, said arm portion being inclined at an angle of 90° relative to said base when the arm assembly is in the open position.

5. The portable computer of claim 1 in which said hinge device includes a first locking position in which said arm assembly is releasably secured in the closed position and a second locking position in which said arm assembly is releasably secured in the open position.

6. The portable computer of claim 1, and further comprising a second hinge device pivotally coupling said second end of said one of said arm portions to said display member.

7. The portable computer of claim 1 in which said hinge device includes a locking position in which said display member is releasably secured in a predetermined position.

8. The portable computer of claim 1 in which said screen is configured for inputting data to said portable computer.

9. The portable computer of claim 1, and further comprising a power source carried by said base, said power source being positioned on the pivot axis defined by said first ends of said arm portions.

10. The portable computer of claim 1 in which said base has a concave cross-sectional shape, the concave surface of said base and said arm portions defining a pocket shaped to receive said rear end portion of said base.

11. The portable computer in claim 1, wherein:
the height and angle of the display relative to the base may be adjusted to a convenient viewing position.

12. The portable computer in claim 1, wherein:
the keyboard is curved about an axis intersecting the middle of the keyboard, the keyboard ergonomically positioning the hands of the user with the elbows extending outwardly from the body.

13. The portable computer in claim 1, wherein:
the arm assembly couples the display member to the base such that the display member may be moved to a plurality of different positions, including a plurality of open positions in which the display is tilted at a viewing angle;
both the height and angle of the display member and the screen relative to the base may be adjusted; and
said height and angle adjustment including a position where the display is suspended above an upper surface of the base allowing the display to be oriented at an angle greater than 90° without significantly increasing overall footprint size.

14. The portable computer in claim 1, wherein:
the arm assembly couples the display member to the base such that the display member may be moved to a plurality of different positions, including a plurality of open positions in which the display is tilted at a viewing angle;
both the height and angle of the display member and the screen relative to the base may be adjusted; and
said height and angle adjustment including a position where the lower edge of the display rests on an upper surface of the base so that the display does not increase the footprint size of the portable computer.

15. The portable computer in claim 1, wherein:
the arm assembly couples the display member to the base such that the display member may be moved to a plurality of different positions;
said portable computer further comprises a touch sensitive screen for inputting data and commands; and
both the height and angle of the display member and the screen relative to the base are adjusted so that the screen is exposed when the display is lowered onto an upper surface of the base so that the computer functions as a notepad computer and data is entered entirely through the touch sensitive screen.

16. The portable computer in claim 1, wherein:
lower ends of the arm portions are pivotally coupled to side edges of the base at a rear end portion of the base; and
the rigid connecting portion extends along the rear end of the base and has a curved tubular cross section that reinforces the arm assembly to provide stability and reduce torsional stresses during movement of the arm assembly.

17. The portable computer in claim 1, wherein:
the arm portions are oriented substantially perpendicular to the base ensuring that the center of gravity of the display is always located directly above the base, increasing the stability of the computer and preventing the computer from falling backward.

18. The portable computer in claim 1, wherein:

a rear end portion of the base is formed with an enlarged rounded portion;

the connecting portion has a generally concave partially tubular cross sectional shape which conforms to the shape of the rounded portion of the base;

the enlarged rounded portion forming a housing for a battery;

as the arm assembly is rotated relative to the base, the connecting portion slides around the rounded portion of the base; and the concave shape facilitating manipulation of the arm assembly between a plurality of operating positions and increases the rigidity of the connecting portion and the arm portions formed integral therewith.

19. The portable computer in claim 1, wherein:

the arm assembly includes a U-shaped rigid partially tubular back member including back sections of the arm portions and the connecting portion, the unitary back member formed of a metal for optimum strength.

20. The portable computer in claim 1, wherein:

arm portion is pivotally coupled to the display member by a first friction hinge and to the base by a second friction hinge;

each hinge including an outer sleeve and a cylinder;

the sleeve being fixedly mounted to the arm portion, with an attachment tab projecting from the cylinder extending into the display member;

the attachment tab is mounted to an interior skeletal frame of the display member;

the cylinder being rotatable within the sleeve upon application of sufficient force to the cylinder, through the display member and the attachment tab, to overcome the frictional forces between the exterior of the cylinder and the interior of the sleeve; and the frictional forces of the first and second hinges between the sleeve and the cylinder being sufficient to retain the display in the desired position once adjusted to that position by a user.

21. The portable computer in claim 1, wherein:

a first one of the arm portions is provided with both hinges and the second one of the arm portion is provided with no hinges but merely hold the display in alignment with the arm portions;

the second arm portion being provided with an internal conduit which houses the electrical connectors coupling the display screen to electrical components housed in the base;

the electrical connectors being carried by a ribbon;

the ribbon being threaded through a path in the second arm portion which minimizes the stresses exerted on the ribbon during rotation of the arm assembly relative to the base, and rotation of the display member relative to the arm member;

the stress minimizing path including providing a complete first loop formed in the ribbon as the ribbon enters the arm portion from the display member, the first loop selectively becoming tighter and looser as the display is pivoted relative to the arm portion, preventing the electrical connectors from crimping; and the stress minimizing path further including providing a second loop before the ribbon enters the base, the second loop selectively becoming tighter and looser as the arm portion is pivoted relative to the base, preventing the electrical connectors from crimping; the second loop reducing stresses on the ribbon during manipulation of the arm assembly.

22. The portable computer in claim 15, wherein:

the touch sensitive screen is configured to display a virtual keyboard such that areas of the screen display keys, and when touched transmit the letter, number, or other character to the CPU as if an actual keyboard were provided; and the touch sensitive screen being operable to input graphical (stylus) inputs as well as keyboard inputs without changing the configuration of the computer.

23. The portable computer in claim 22, wherein:

the screen display keys are arranged in a QWERTY pattern.

24. The portable computer in claim 20, wherein:

each of the hinges includes a plurality of locking positions, a first one of the locking positions corresponding to a closed position of the display member and a second one of the locking position corresponding to an open position of the display member; and when the display member is in either of these two locking positions, a greater force must be applied to the display member to move the display member from the locking position.

25. The portable computer in claim 20, wherein:

the hinge includes an outer sleeve mounted to the base, and an attachment tab projecting from the cylinder mounted to the arm portion;

the sleeve being is mounted to the base by a metal band which is mounted at one end to the base; and the band extends around the sleeve and another end of the band engages the rear edge of the base, with the band applying a compressive force to secure the sleeve in a fixed position.

26. The portable computer in claim 24, wherein:

between the first and second locking positions, the display member is held in place by friction.

27. The portable computer in claim 25, wherein:

as the arm assembly approaches the closed position the friction hinge includes a detent mechanism that tends to rotate the hinge and structures attached thereto toward the closed position such that the display member is snapped toward the base, facilitating closure of the computer so that a separate locking mechanism is not required, yet the computer is maintained in a closed position.

28. A portable information device comprising:

a base including a keyboard;

a display member having a front surface including a screen for displaying information;

display member attachment means including an arm portion for attaching said display member to said base such that said screen is positionable in any one of at least first, second, and third configurations;

said first configuration providing display and touch-sensitive operational control without access to a physical keyboard or keyboard operational control;

said second configuration providing display and keyboard operational control; and said third configuration providing display and wireless operational control only without any physical keyboard or other keyboard operational control;

said display member attachment means further including:

a slip joint extending along an axis of rotation of said base into said arm portion;

a flexible printed circuit ribbon connector having a plurality of electrical conductors extending between base and said arm joined at substantially right angles;

said printed circuit ribbon connector having a substantially right angle bend in the region of said slip joint; and said printed circuit ribbon being threaded through a path from said base into said arm via said slip joint which minimizes stresses exerted on said ribbon during rotation of said arm;

said stress minimizing path including providing a complete first loop formed in said ribbon as said ribbon enters said base from said arm, said first loop selectively becoming tighter and looser as said arm is pivoted relative to said base, preventing said electrical conductors from rubbing or crimping.

29. In a portable computer, a method of routing a flexible printed circuit ribbon connector having a plurality of electrical traces between first and second members joined at substantially right angles and having relative rotational movement, said method comprising:

providing a slip joint along an axis of rotation of said first member into said second member;

forming said printed circuit ribbon connector to have a substantially right angle bend in the region of said slip joint; and threading said ribbon through a path from said first member into said second member via said slip joint which minimizes stresses exerted on said ribbon during rotation of said members;

said stress minimizing path including providing a complete first loop formed in said ribbon as said ribbon enters said second portion from said first portion, said first loop selectively becoming tighter and looser as said second member is pivoted relative to said first member, preventing said electrical connectors from crimping.

30. The method in claim 29, wherein said first member comprises a base portion of said portable computer and said second member comprises a display holding arm portion of said portable computer.

31. The method in claim 29, wherein said first member comprises a display portion of said portable computer and said second member comprises a holding arm portion attaching said display to a base portion of said portable computer.

32. The method in claim 29, wherein said slip joint is formed as a hollow conduit between said first and second members.

33. The method in claim 29, wherein said stresses exerted are minimized during rotation by eliminating any torsional twisting of said electrical traces about a longitudinal axis of said electrical traces.

34. The method in claim 29, wherein said first loop is sized to prevent contact between said loop and surfaces of said slip joint.

35. The method in claim 29, wherein:

said first member comprises a base portion of said portable computer and said second member comprises a display holding arm portion of said portable computer;

said slip joint is formed as a hollow conduit between said first and second members;

said stresses exerted are minimized during rotation by eliminating any torsional twisting of said electrical traces about a longitudinal axis of said electrical traces; and said first loop is sized to prevent contact between said loop and surfaces of said slip joint.

36. The method in claim 29, wherein:

said first member comprises a display portion of said portable computer and said second member comprises a holding arm portion attaching said display to a base portion of said portable computer;

said slip joint is formed as a hollow conduit between said first and second members;

said stresses exerted are minimized during rotation by eliminating any torsional twisting of said electrical traces about a longitudinal axis of said electrical traces; and said first loop is sized to prevent contact between said loop and surfaces of said slip joint.

37. A portable computer of the type having a base portion and a display portion pivotally attached via a pivotal attachment to said base portion, electronic components disposed in each of said base portion and display portion being coupled for communication of electrical signals via conductors passing through said pivotal attachment; said portable computer characterized in that:

said conductors include at least one flexible printed circuit ribbon connector having a plurality of electrical traces routed through a slip joint extending along an axis of rotation of said pivotal attachment between said base portion and said display portion at substantially right angles and having relative rotational movement;

said printed circuit ribbon connector having a substantially right angle bend in the region of said slip joint; and said printed circuit ribbon being threaded through a path from said first base portion into said display portion via said slip joint which minimizes stresses exerted on said ribbon during rotation of said display portion relative to said base portion;

said stress minimizing path including providing a complete first loop formed in said ribbon as said ribbon enters said display portion from said base portion, said first loop selectively becoming tighter and looser as said display portion is pivoted relative to said base portion, preventing said electrical connectors from crimping and from rubbing.

38. The portable computer in claim 37, wherein said display portion comprises a display panel and an arm portion coupling said display panel to said base portion, and wherein said printed circuit ribbon extends from said base portion into said arm portion.

* * * * *